US008730419B2

(12) United States Patent
Yamazaki

(10) Patent No.: US 8,730,419 B2
(45) Date of Patent: May 20, 2014

(54) DISPLAY DEVICE AND ELECTRONIC APPLIANCE INCLUDING THE DISPLAY DEVICE

(71) Applicant: Semiconductor Energy Laboratory Co., Ltd., Atsugi (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/649,738

(22) Filed: Oct. 11, 2012

(65) Prior Publication Data

US 2013/0045554 A1    Feb. 21, 2013

Related U.S. Application Data

(62) Division of application No. 12/230,332, filed on Aug. 27, 2008, now abandoned.

(30) Foreign Application Priority Data

Aug. 29, 2007   (JP) ................................. 2007-222787

(51) Int. Cl.
G02F 1/015         (2006.01)
(52) U.S. Cl.
USPC ............. 349/43; 349/140; 349/149; 349/150; 257/64; 257/59
(58) Field of Classification Search
CPC ..... G02F 1/3556; G02F 1/00; G02F 2202/10; G02F 2001/136281; G02F 1/03
USPC ................ 349/43, 140, 149, 150; 257/64, 59, 257/E23.176
See application file for complete search history.

(56) References Cited

U.S. PATENT DOCUMENTS

| 5,744,824 | A  | 4/1998  | Kousai et al.   |
|-----------|----|---------|-----------------|
| 5,757,456 | A  | 5/1998  | Yamazaki et al. |
| 5,766,977 | A  | 6/1998  | Yamazaki        |
| 5,834,327 | A  | 11/1998 | Yamazaki et al. |
| 6,335,231 | B1 | 1/2002  | Yamazaki et al. |

(Continued)

FOREIGN PATENT DOCUMENTS

JP    09-127352 A    5/1997
JP    11-160734      6/1999

(Continued)

*Primary Examiner* — Kaveh Kianni
(74) *Attorney, Agent, or Firm* — Eric J. Robinson; Robinson Intellectual Property Law Office, P.C.

(57) ABSTRACT

To provide a display device which has a narrower frame region and which includes a driver circuit not affected by variation in transistor characteristics. A base substrate having an insulating surface to which a single-crystal semiconductor layer is attached is divided into strips and is used for a driver circuit of a display device. Alternatively, a base substrate having an insulating surface to which a plurality of single-crystal semiconductor layers is attached is divided into strips and is used for a driver circuit of a display device. Accordingly, a driver circuit corresponding to a size of a display device can be used for the display device, and a display device which has a narrower frame region and which includes a driver circuit not affected by variation in transistor characteristics can be provided.

17 Claims, 19 Drawing Sheets

(56) References Cited

U.S. PATENT DOCUMENTS

| | | | |
|---|---|---|---|
| 6,362,866 B1 | 3/2002 | Yamazaki et al. | |
| 6,636,280 B1 * | 10/2003 | Miyazawa et al. | 349/43 |
| 6,709,901 B1 * | 3/2004 | Yamazaki et al. | 438/149 |
| 6,882,012 B2 | 4/2005 | Yamazaki et al. | |
| 6,900,873 B2 | 5/2005 | Yamazaki et al. | |
| 6,906,343 B2 * | 6/2005 | Yamazaki | 257/59 |
| 7,176,490 B2 * | 2/2007 | Isobe et al. | 257/59 |
| 7,214,555 B2 | 5/2007 | Yamazaki et al. | |
| 7,244,990 B2 | 7/2007 | Takafuji et al. | |
| 7,262,464 B2 | 8/2007 | Takafuji et al. | |
| 7,271,858 B2 | 9/2007 | Yamazaki et al. | |
| 7,317,209 B2 * | 1/2008 | Kurosawa et al. | 257/72 |
| 7,456,104 B2 | 11/2008 | Kusumoto et al. | |
| 7,508,034 B2 | 3/2009 | Takafuji et al. | |
| 7,521,368 B2 * | 4/2009 | Yamaguchi et al. | 438/706 |
| 7,564,058 B2 * | 7/2009 | Yamazaki et al. | 257/72 |
| 7,667,235 B2 * | 2/2010 | Yamazaki et al. | 257/72 |
| 7,696,065 B2 | 4/2010 | Sato et al. | |
| 7,728,383 B2 | 6/2010 | Kusumoto et al. | |
| 7,995,183 B2 * | 8/2011 | Yamazaki et al. | 349/152 |
| 8,040,456 B2 * | 10/2011 | Yamazaki et al. | 349/61 |
| 8,064,323 B2 * | 11/2011 | Ono | 369/126 |
| 2001/0025992 A1 | 10/2001 | Nakajima et al. | |
| 2001/0038127 A1 * | 11/2001 | Yamazaki et al. | 257/359 |
| 2002/0096680 A1 * | 7/2002 | Sugano et al. | 257/66 |
| 2002/0163035 A1 * | 11/2002 | Yamazaki | 257/336 |
| 2003/0218171 A1 * | 11/2003 | Isobe et al. | 257/64 |
| 2004/0169786 A1 * | 9/2004 | Yamazaki et al. | 349/61 |
| 2004/0201022 A1 * | 10/2004 | Yamazaki et al. | 257/72 |
| 2004/0224486 A1 * | 11/2004 | Ichijo et al. | 438/482 |
| 2005/0020037 A1 * | 1/2005 | Asami et al. | 438/485 |
| 2005/0041166 A1 * | 2/2005 | Yamazaki et al. | 349/42 |
| 2005/0045729 A1 * | 3/2005 | Yamazaki | 235/492 |
| 2005/0121672 A1 * | 6/2005 | Yamazaki et al. | 257/59 |
| 2005/0157242 A1 | 7/2005 | Yamazaki et al. | |
| 2005/0158929 A1 * | 7/2005 | Yamazaki et al. | 438/166 |
| 2005/0161742 A1 * | 7/2005 | Isobe et al. | 257/347 |
| 2005/0200786 A1 * | 9/2005 | Watanabe et al. | 349/138 |
| 2005/0250308 A1 * | 11/2005 | Yamaguchi et al. | 438/618 |
| 2006/0023058 A1 * | 2/2006 | Tanaka | 347/224 |
| 2006/0046336 A1 * | 3/2006 | Shoji et al. | 438/30 |
| 2006/0115983 A1 * | 6/2006 | Fujii et al. | 438/640 |
| 2006/0279503 A1 * | 12/2006 | Yamazaki et al. | 345/98 |
| 2007/0046846 A1 * | 3/2007 | Ono | 349/42 |
| 2007/0063226 A1 * | 3/2007 | Tanaka et al. | 257/213 |
| 2007/0115416 A1 | 5/2007 | Yamazaki et al. | |
| 2007/0178672 A1 * | 8/2007 | Tanaka et al. | 438/487 |
| 2007/0262318 A1 * | 11/2007 | Shoji et al. | 257/72 |
| 2007/0284991 A1 * | 12/2007 | Egi et al. | 313/479 |
| 2008/0008612 A1 * | 1/2008 | Kim et al. | 418/55.1 |
| 2008/0042926 A1 * | 2/2008 | Egi et al. | 345/32 |
| 2008/0057604 A1 * | 3/2008 | Tanaka | 438/29 |
| 2009/0002591 A1 * | 1/2009 | Yamazaki et al. | 349/43 |
| 2009/0026453 A1 * | 1/2009 | Yamazaki | 257/59 |
| 2010/0072495 A1 * | 3/2010 | Yamazaki | 257/89 |
| 2010/0136743 A1 * | 6/2010 | Akimoto et al. | 438/104 |
| 2010/0327290 A1 | 12/2010 | Honda | |

FOREIGN PATENT DOCUMENTS

| | | |
|---|---|---|
| JP | 2001-330860 | 11/2001 |
| JP | 2003-255386 | 9/2003 |
| JP | 2005-026472 A | 1/2005 |
| JP | 2006-080237 A | 3/2006 |
| JP | 2007-013106 A | 1/2007 |

* cited by examiner

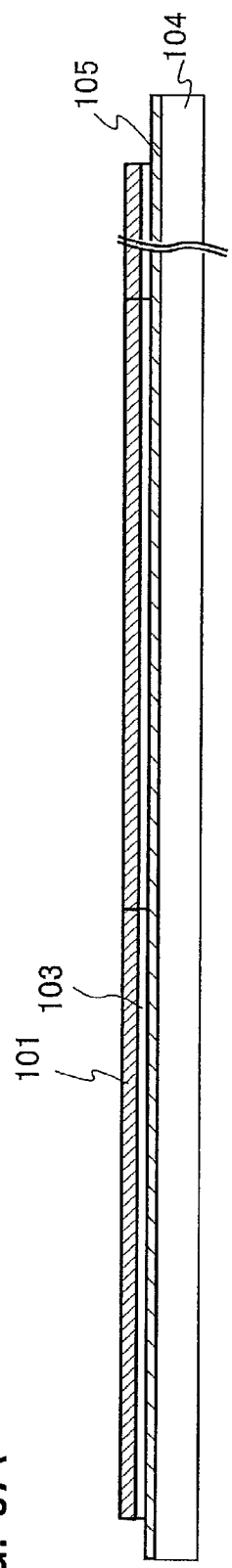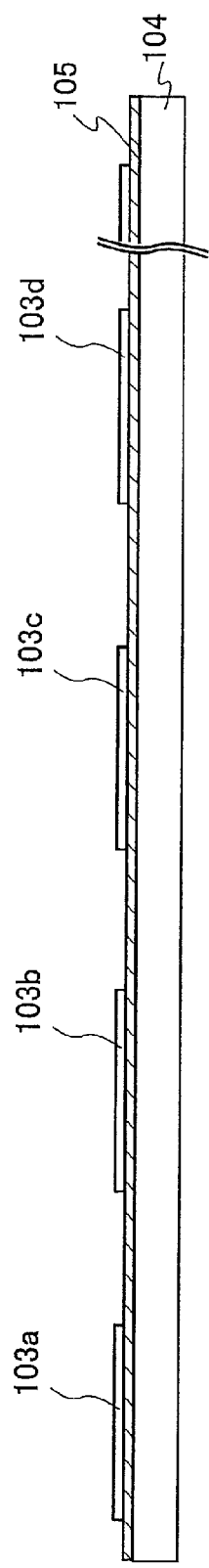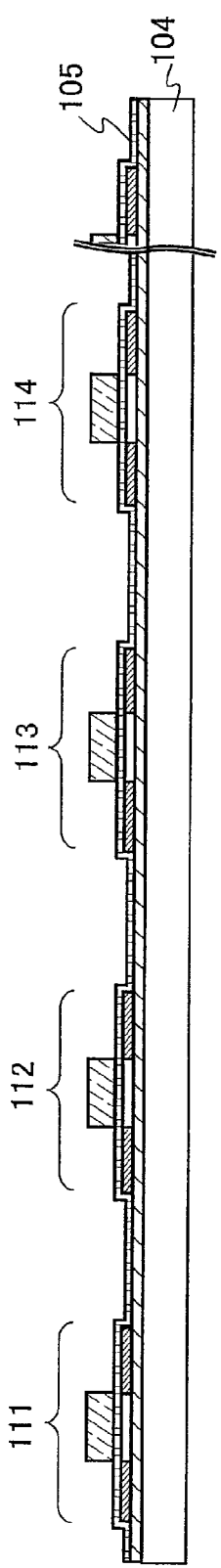

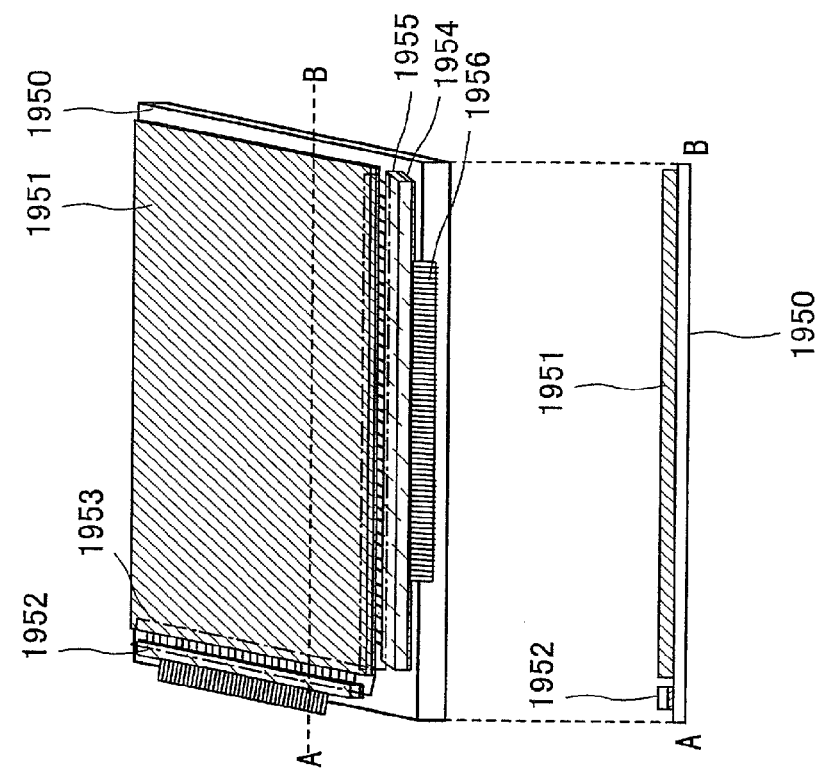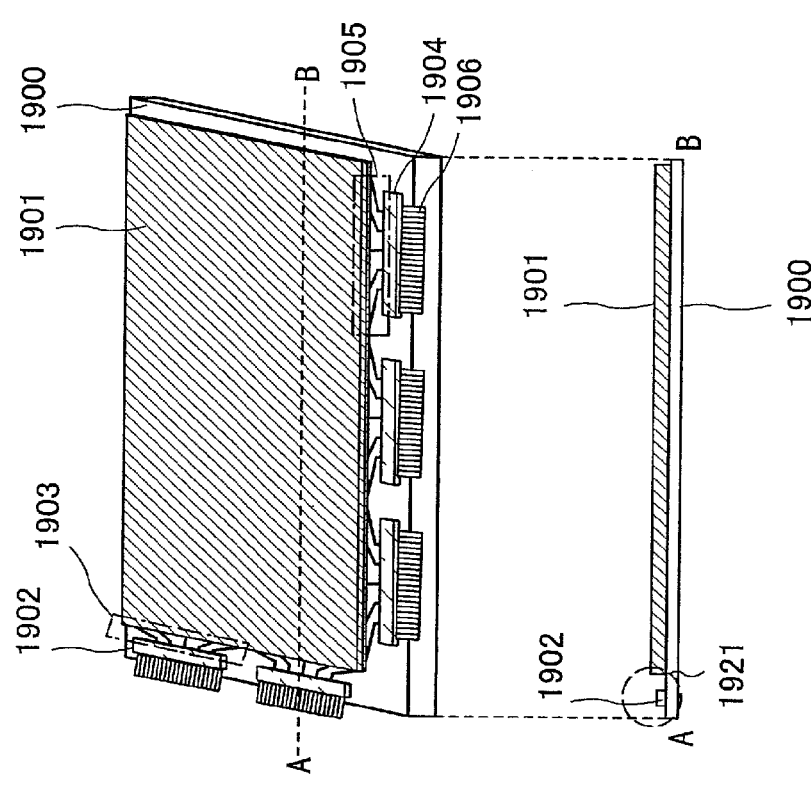

DISPLAY DEVICE AND ELECTRONIC APPLIANCE INCLUDING THE DISPLAY DEVICE

BACKGROUND OF THE INVENTION

1. Field of the Invention

The present invention relates to a display device and particularly to a driver circuit for displaying images in the display device. The present invention also relates to an electronic appliance including the display device.

2. Description of the Related Art

In recent years, the popularity of display devices such as liquid crystal display devices and electroluminescent (EL) display devices has increased rapidly because such display devices can be lightweight and have a large-area screen as compared with CRT display devices.

Driving methods of display devices include a passive matrix method and an active matrix method. An active matrix method has been employed for display portions of television receivers, cellular phones, and the like because an active matrix method can achieve lower power consumption, higher definition, enlargement of substrates, and the like as compared with a passive matrix method.

Panels of an active matrix method have come to be larger in size and to have higher definition, and are required to achieve higher performance of driver circuits for controlling driving of pixel portions. Therefore, a technique has been employed in which a driver circuit is mounted by a COG (chip on glass) method (see Reference 1: Japanese Published Patent Application No. 2003-255386) or by a TAB (tape automated bonding) method. FIG. 19A shows a display device employing a COG method.

In FIG. 19A, a pixel portion in which pixels are arranged in matrix is formed over a substrate 1900 having an insulating surface and a counter substrate 1901 is formed so as to cover the pixel portion. The pixels are arranged in matrix in such a manner that each pixel is disposed at an intersection of a scanning line 1903 extending from each scanning line side driver IC 1902 and a signal line 1905 extending from each signal line side driver IC 1904. Each pixel in the pixel portion is provided with a switching element and a pixel electrode layer connected to the switching element. A typical example of the switching element is a thin film transistor, and a thin film transistor has its gate connected to the scanning line 1903 and its source or drain connected to the signal line 1905. Moreover, the scanning line side driver ICs 1902 and the signal line side driver ICs 1904 are each connected to an FPC (flexible printed circuit) 1906. FIG. 19A also shows a cross section of the display device along a dotted line A-B.

As another method of mounting high-performance driver circuits, the following technique is given as disclosed in Reference 2 (Japanese Published Patent Application No. H11-160734): driver circuits are formed using thin film transistors (TFTs; also simply called transistors) manufactured with use of a non-single-crystal semiconductor material whose crystallinity has been enhanced by laser irradiation over a substrate made of glass or the like; the substrate having the driver circuits is divided into strips (stick forms); and then the stick-form driver circuits are mounted on a display device. FIG. 19B shows a display device of a driving method which uses stick-form driver circuits (this driving method is hereinafter referred to as a stick method).

In FIG. 19B, a pixel portion in which pixels are arranged in matrix is formed over a substrate 1950 having an insulating surface and a counter substrate 1951 is formed so as to cover the pixel portion. The pixels are arranged in matrix in such a manner that each pixel is disposed at an intersection of a scanning line 1953 extending from a scanning line side stick driver 1952 and a signal line 1955 extending from a signal line side stick driver 1954. Each pixel in the pixel portion is provided with a switching element and a pixel electrode layer connected to the switching element. A typical example of the switching element is a thin film transistor, and a thin film transistor has its gate connected to the scanning line 1953 and its source or drain connected to the signal line 1955. Moreover, the scanning line side stick driver 1952 and the signal line side stick driver 1954 are each connected to an FPC (flexible printed circuit) 1956. FIG. 19B also shows a cross section of the display device along a dotted line A-B.

The display device employing a COG method shown in FIG. 19A has the scanning line side driver ICs 1902 and the signal line side driver ICs 1904 provided apart from each other at a predetermined interval in accordance with the size of the display device. The integration degree of the scanning line side driver ICs 1902 and the signal line side driver ICs 1904 is high; however, the pixel portion can operate without troubles even though these ICs are provided apart from each other. In contrast to this, it is necessary to lead wirings to the pixel portion when the scanning lines 1903 and the signal lines 1905 extend. Therefore, a frame region 1921 (a peripheral region of the pixel portion) of the display device needs to be very wide. In the display device, the increase in width of the frame region is disadvantageous in that the small size, which is an advantage of liquid crystal display devices or EL display devices, is not achieved.

In the display device of the stick method shown in FIG. 19B, the scanning line side stick driver 1952 and the signal line side stick driver 1954 are provided in accordance with the size of the display device. As for the size, the scanning line side stick driver 1952 and the signal line side stick driver 1954 can be formed in accordance with the size of the pixel portion because these ICs are obtained by dividing glass substrates. As for their characteristics, on the other hand, since the driver circuits are formed using thin film transistors with use of a non-single-crystal semiconductor material whose crystallinity has been enhanced by laser irradiation, the characteristics of the thin film transistors in the driver circuits, such as threshold voltage, vary in some cases due to laser fringes caused at the time of the laser irradiation. As a result, the scanning line side stick driver 1952 and the signal line side stick driver 1954 formed with the use of the non-single-crystal semiconductor material whose crystallinity has been enhanced by the laser irradiation has a possibility of causing an operation error.

SUMMARY OF THE INVENTION

In view of the aforementioned problems, it is an object of the present invention to provide a display device which has a narrower frame region and which includes a driver circuit not affected by variation in transistor characteristics. Moreover, it is an object of the present invention to provide an electronic appliance which has the display device in a display portion.

In the present invention, a base substrate having an insulating surface to which a single-crystal semiconductor layer is attached is divided into strips and used for a driver circuit of a display device. In the present invention, moreover, a plurality of single-crystal semiconductor layers is attached to a base substrate having an insulating surface and then the substrate is divided into strips and used for a driver circuit of a display device. Accordingly, the display device can include the driver circuit corresponding to the size of the display device and the display device which has a narrower frame region and which is not affected by variation in transistor characteristics can be provided.

An aspect of a display device of the present invention includes a base substrate and a driver circuit over the base substrate. The driver circuit has a plurality of thin film transistors manufactured using semiconductor films. The semiconductor films are obtained in such a manner that the semiconductor films are separated from a single-crystal semiconductor substrate and are attached and bonded a plurality of times. In this display device, the base substrate having the driver circuit is mounted on a substrate having a pixel portion.

Another aspect of a display device of the present invention includes a base substrate and a driver circuit over the base substrate. The driver circuit has thin film transistors manufactured using semiconductor films. The semiconductor films are obtained in such a manner that a plurality of first semiconductor films separated from a first single-crystal semiconductor substrate and a plurality of second semiconductor films separated from a second single-crystal semiconductor substrate are attached and bonded a plurality of times. The first single-crystal semiconductor substrate has a plurality of first projections at which the first semiconductor films are separated and the second single-crystal semiconductor substrate has a plurality of second projections at which the second semiconductor films are separated. The second semiconductor films have different crystal plane orientation from the first semiconductor films and the base substrate having the driver circuit is mounted on a substrate having a pixel portion.

In accordance with the present invention, a display device which has a narrower frame region and which includes a driver circuit not affected by variation in transistor characteristics can be provided and moreover an electronic appliance including the display device can be provided. Therefore, the increase in area of a frame region which is caused by the increase in size and definition of a display device can be suppressed, whereby a smaller display device and an electronic appliance including the display device can be provided.

BRIEF DESCRIPTION OF THE DRAWINGS

FIGS. 9A to 9C are drawings for describing Embodiment Mode 1.
FIGS. 19A and 19B each show a structural example of a conventional panel.

DETAILED DESCRIPTION OF THE INVENTION

Figure 1A:
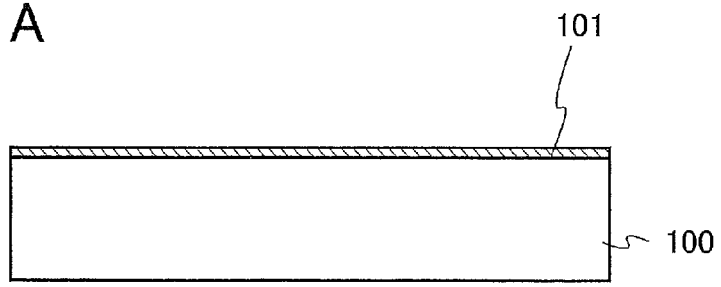
FIGS. 1A to 1D are drawings for describing Embodiment Mode 1.

Embodiment modes of the present invention will hereinafter be described with reference to the drawings. However, the present invention is not limited to the following description, and it is easily understood by those skilled in the art that the modes and details can be variously changed without departing from the scope and spirit of the present invention. Therefore, the present invention is not construed as being limited to the description of the following embodiment modes. In the structures of the present invention described hereinafter, reference numeral indicating the same portion is used in common in different drawings.

(Embodiment Mode 1)

This embodiment mode describes a driver circuit of a display device and a manufacturing method thereof. The driver circuit is formed in such a manner that a single-crystal semiconductor substrate is attached to a different kind of substrate (hereinafter referred to as a base substrate) and the base substrate is divided into stripe forms.

First, as shown in FIG. 1A, an insulating film 101 is formed over a single-crystal semiconductor substrate 100. As the single-crystal semiconductor substrate 100, a single-crystal semiconductor substrate formed of silicon, germanium, or the like can be used. Alternatively, a single-crystal semiconductor substrate formed of a compound semiconductor such as gallium arsenide or indium phosphide can be used as the single-crystal semiconductor substrate 100. Further alternatively, a semiconductor substrate formed of silicon having crystal lattice distortion, silicon germanium obtained by adding germanium to silicon, or the like may be used as the single-crystal semiconductor substrate 100. Silicon having distortion can be formed when it is formed over silicon nitride or silicon germanium, which has larger lattice constant than silicon.

The insulating film 101 is formed of an insulating material such as silicon oxide, silicon nitride oxide, silicon oxynitride, or silicon nitride. A single insulating film or a stack of plural insulating films may be used as the insulating film 101. For example, the insulating film 101 is formed of silicon oxide in this embodiment mode.

It is to be noted that silicon oxynitride includes a larger amount of oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide includes a larger amount of nitrogen than oxygen and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. It is to be noted that the percentage of nitrogen, oxygen, silicon, and hydrogen fall within the range given above where the total of atoms contained in silicon oxynitride or silicon nitride oxide is defined as 100 at. %.

For example, in the case of using silicon oxide for the insulating film 101, the insulating film 101 can be formed using a mixed gas of silane and oxygen, a mixed gas of TEOS (tetraethoxysilane) and oxygen, or the like by a vapor deposition method such as thermal CVD, plasma CVD, atmospheric pressure CVD, or bias ECRCVD. In this case, a surface of the insulating film 101 may be densified by oxygen plasma treatment. In the case of using silicon nitride for the insulating film 101, the insulating film 101 can be formed using a mixed gas of silane and ammonium by a vapor deposition method such as plasma CVD. Alternatively, in the case of using silicon nitride oxide for the insulating film 101, the insulating film 101 can be formed using a mixed gas of silane and ammonium or a mixed gas of silane and nitrogen oxide by a vapor deposition method such as plasma CVD.

Further alternatively, the insulating film 101 may be formed of silicon oxide by a chemical vapor deposition method with use of an organic silane gas. As the organic silane gas, a compound including silicon such as the following can be used: tetraethyl orthosilicate (TEOS, chemical formula: $Si(OC_2H_5)_4$); tetramethylsilane (TMS, chemical formula: $Si(CH_3)_4$); tetramethylcyclotetrasiloxane (TMCTS); octamethylcyclotetrasiloxane (OMCTS); hexamethyldisilazane (HMDS); triethoxysilane (chemical formula: $SiH(OC_2H_5)_3$); or trisdimethylaminosilane (chemical formula: $SiH(N(CH_3)_2)_3$).

Figure 1B:
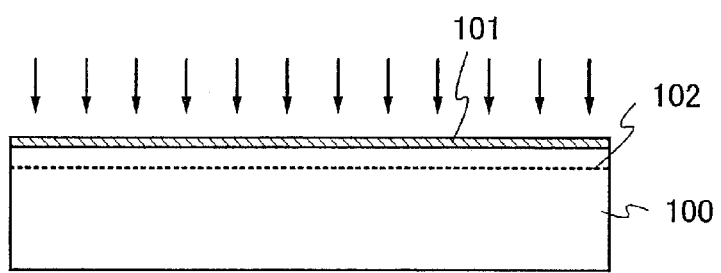
Figure 1C:
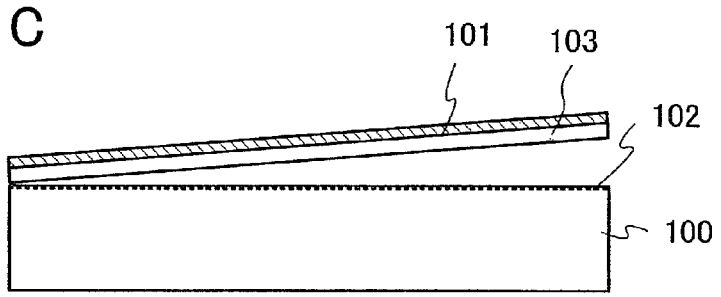

Next, as shown in FIG. 1B, hydrogen or a rare gas, or hydrogen ions or rare gas ions are introduced into the single-crystal semiconductor substrate 100 as indicated by arrows, whereby a defect layer 102 having very small voids is formed in a region at a predetermined depth from a surface of the single-crystal semiconductor substrate 100. The position at which the defect layer 102 is formed depends on the acceleration voltage at the time of the above introduction. Based on the position of the defect layer 102, the thickness of a semiconductor film 103 formed from the single-crystal semiconductor substrate 100 is determined; therefore, the acceleration voltage at the time of the introduction is determined in consideration of the thickness of the semiconductor film 103. Moreover, the position of the defect layer 102 can be changed not only by the acceleration voltage at the time of the above introduction but also by the thickness of the insulating film 101. For example, the thickness of the semiconductor film 103 can be decreased by increasing the thickness of the insulating film 101. The thickness of the semiconductor film 103 is in the range of, for example, 10 nm to 200 nm, preferably 10 nm to 50 nm. For example, in the case of introducing hydrogen to the single-crystal semiconductor substrate 100, the dosage is desirably in the range of $1 \times 10^{16}/cm^2$ to $1 \times 10^{17}/cm^2$. In this embodiment mode, the dosage is $1.75 \times 10^{16}/cm^2$ and the acceleration voltage is 40 kV to introduce hydrogen or hydrogen ions.

The introduction of hydrogen or a rare gas, or hydrogen ions or rare gas ions into the single-crystal semiconductor substrate 100 at high concentration in the step of forming the defect layer 102 makes a surface of the single-crystal semiconductor substrate 100 rough in some cases. In such cases, the interface state density between the semiconductor film formed from the single-crystal semiconductor substrate 100 and a gate insulating film in contact with the semiconductor film varies. With the provision of the insulating film 101, however, the surface of the single-crystal semiconductor substrate 100 is protected at the time of introducing hydrogen or a rare gas, or hydrogen ions or rare gas ions. Therefore, it is possible to prevent the surface of the single-crystal semiconductor substrate 100 from getting rough and also prevent the aforementioned interface state density from varying.

Next, heat treatment is performed so that very small voids adjacent to each other in the defect layer 102 are combined, whereby the very small voids increase in volume. As a result, the single-crystal semiconductor substrate 100 is separated at the defect layer 102; specifically, the semiconductor film 103 is separated together with the insulating film 101 from the single-crystal semiconductor substrate 100. The heat treatment may be performed at temperatures ranging from, for example, 400° C. to 600° C.

It is to be noted that the heat treatment may be performed by dielectric heating with use of a high-frequency wave such as a microwave. The heat treatment by dielectric heating can be performed by irradiating the single-crystal semiconductor substrate 100 with a high-frequency wave which has a frequency in the range of 300 MHz to 3 THz generated by a high-frequency wave generator. Specifically, the single-crystal semiconductor substrate 100 is irradiated with a microwave with a frequency of 2.45 GHz at 900 W for 14 minutes so that the very small voids adjacent to each other in the defect layer are combined, whereby the single-crystal semiconductor substrate 100 can be separated finally.

Figure 1D:
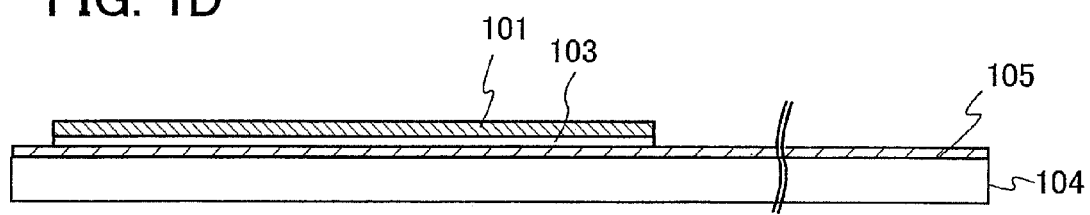

Subsequently, as shown in FIG. 1D, the semiconductor film 103 and the base substrate 104 are attached to each other in such a manner that a surface of the semiconductor film 103 that is exposed due to the separation faces the base substrate 104. In this embodiment mode, an insulating film 105 is formed over the base substrate 104. The semiconductor film 103 and the base substrate 104 can be attached and bonded to each other by attaching and bonding the insulating film 105 and the semiconductor film 103 to each other. After attaching and bonding the semiconductor film 103 and the insulating film 105, heat treatment is preferably performed at temperatures ranging from 400° C. to 600° C. in order to strengthen the bonding further.

Since the bonding is formed by Van der Vaals force, firm bonding can be obtained even at room temperature. It is to be noted that since the aforementioned bonding can be performed at low temperature, a variety of substrates can be used as the base substrate 104. For example, the base substrate 104 may be a glass substrate made of aluminosilicate glass, barium borosilicate glass, aluminoborosilicate glass, or the like, a quartz substrate, a sapphire substrate, or the like. Alternatively, the base substrate 104 may be, for example, a semiconductor substrate made of silicon, gallium arsenide, indium phosphide, or the like: Further alternatively, the base substrate 104 may be a metal substrate including a stainless steel substrate.

It is to be noted that the base substrate 104 is not necessarily provided with the insulating film 105 on its surface. Even when the insulating film 105 is not formed, it is possible to bond the base substrate 104 and the semiconductor film 103 to each other. However, the formation of the insulating film 105 on the surface of the base substrate 104 can prevent impurities such as an alkali metal and an alkaline earth metal in the base substrate 104 from entering the semiconductor film 103.

In the case of forming the insulating film 105, not the base substrate 104 but the insulating film 105 is bonded to the semiconductor film 103; therefore, a wider variety of substrates can be used as the base substrate 104. In general, the upper temperature limits of substrates formed of flexible synthetic resins such as plastics tend to be low. However, as long as the substrates can resist process temperatures in manufacturing steps, the substrates formed of such resins can be used as the base substrate 104 in the case of forming the insulating film 105. As the plastic substrates, substrates formed of polyesters typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, and the like can be used.

Before or after attaching the semiconductor film 103 to the base substrate 104, the surface of the semiconductor film 103 that is exposed due to the separation may be subjected to thermal annealing by laser irradiation. When the thermal annealing is performed before the semiconductor film 103 is attached to the base substrate 104, the surface exposed due to the separation is flattened so that the bonding strength can be increased further. On the other hand, when the thermal annealing is performed after the semiconductor film 103 is attached to the base substrate 104, the semiconductor film 103 is partly melted so that the bonding strength can be increased further.

In the case of performing the thermal annealing by laser irradiation, it is desirable to use a fundamental-wave laser beam or a second-harmonic laser beam of a solid-state laser, which is selectively absorbed in a semiconductor. For example, a laser beam with an output power of 100 W emitted from a continuous-wave YAG laser is used. Then, the laser beam is preferably shaped by an optical system so that the laser beam has a rectangular or elliptical shape on an irradiation surface, and the rectangular or elliptical laser beam is delivered to the surface of the semiconductor film 103 that is exposed due to the separation. At this time, the power density needs to be in the range of about 1 kW/cm$^2$ to 100 MW/cm$^2$ (preferably 0.1 MW/cm$^2$ to 10 MW/cm$^2$) and the scanning speed is set in the range of about 10 cm/s to 2000 cm/s; thus, the irradiation is performed.

As a continuous-wave gas laser, an Ar laser, a Kr laser, or the like can be used. Moreover, as a continuous-wave solid-state laser, a YAG laser, a YVO$_4$ laser, a YLF laser, a YAlO$_3$ laser, a forsterite (Mg$_2$SiO$_4$) laser, a GdVO$_4$ laser, a Y$_2$O$_3$ laser, a glass laser, a ruby laser, an alexandrite laser, a Ti:sapphire laser, or the like can be used. Further, as a pulsed laser, an Ar laser, a Kr laser, an excimer laser, a CO$_2$ laser, a YAG laser, a Y$_2$O$_3$ laser, a YVO$_4$ laser, a YLF laser, a YAlO$_3$ laser, a glass laser, a ruby laser, an alexandrite laser, a Ti:sapphire laser, a copper vapor laser, or a gold vapor laser can be used.

The semiconductor film 103 may be attached to the base substrate 104 by the following manner, instead of by just bonding the semiconductor film 103 to the base substrate: vibration at a high frequency of about 10 MHz to 1 THz is applied to the semiconductor film 103 to generate frictional heat between the semiconductor film 103 and the base substrate 104 so that the semiconductor film 103 is partly melted by the heat.

Figure 2:
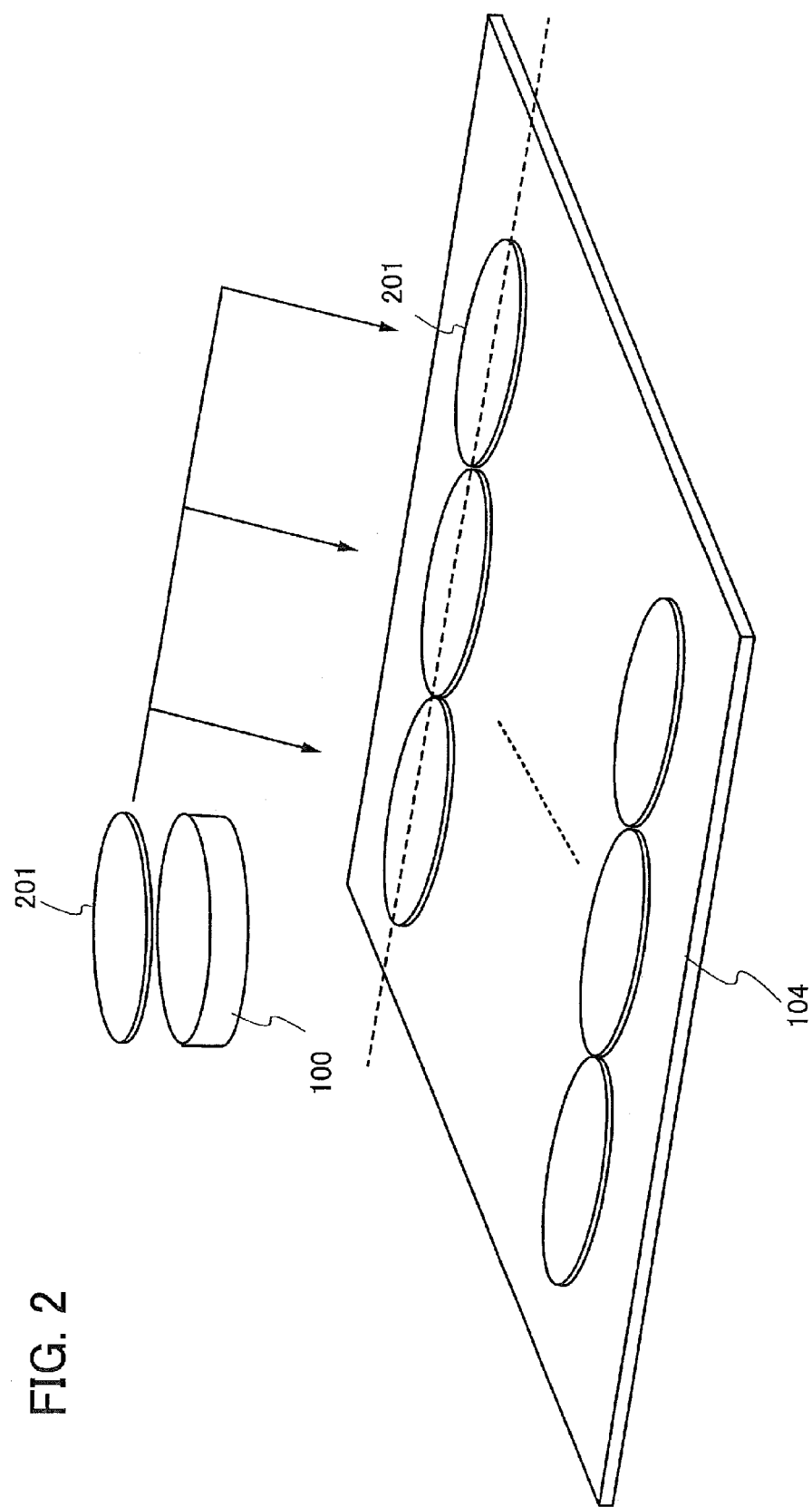
FIG. 2 is a drawing for describing Embodiment Mode 1.

As illustrated in FIG. 2, the semiconductor film 103 and the insulating film 101 (the semiconductor film 103 and the insulating film 101 may hereinafter be referred to as a semiconductor film 201 collectively) used for the driver circuit of the display device are separated from the single-crystal semiconductor substrate 100 and each semiconductor film 201 is attached to the base substrate 104. The plural semiconductor films 201 are attached to the base substrate 104 in such a manner that the semiconductor films 201 are arranged in a longitudinal direction of the driver circuit of the display device in accordance with the length of the driver circuit. By arrangement of the semiconductor films 201 over the base substrate 104 in accordance with the driver circuit of the display device, the driver circuit corresponding to a panel size of a large-sized display device can be manufactured with use of a single-crystal semiconductor substrate such as a silicon wafer with a diameter of about 12 inches. Accordingly, since a plurality of driver ICs is not mounted in accordance with a panel size of a large-sized display device differently from in a COG method, it is possible to narrow the area of the frame region, which used to be large due to leading of wirings and to manufacture the driver circuit with less variation in transistor characteristics by using the semiconductor film formed from the single-crystal semiconductor substrate.

It is to be noted that the semiconductor film 201 is processed into an island-shaped semiconductor film in advance over the base substrate. Then, by addition of an interlayer film, a wiring, and an electrode, a thin film transistor of a circuit included in the driver circuit is formed. The transistor circuit may include either one of or both an n-channel thin film transistor and a p-channel thin film transistor. Moreover, a leading terminal for electrical connection with the outside is additionally formed as necessary. Although this embodiment mode describes the transistor included in the driver circuit as a thin film transistor, it is possible to set the thickness of the semiconductor film freely.

A method of forming semiconductor elements such as thin film transistors by using the semiconductor films 103 and the insulating films 101 is described with reference to FIGS. 9A to 9C. As for the plural semiconductor films 103 and the plural insulating films 101 provided in a longitudinal direction of a driver circuit of a display device in accordance with the length of the driver circuit as shown in the cross-sectional view of FIG. 9A, the insulating films 101 formed over the semiconductor films 103 are removed and the semiconductor films 103 are partly etched. Thus, semiconductor films 103a to 103d are formed from the semiconductor films 103. It is to be noted that when the thin film transistors are formed by removing the joint between the attached semiconductor films 103 at the time of etching the semiconductor films, it is possible to manufacture a driver circuit with less variation in transistor characteristics.

After removing the insulating films 101 formed over the semiconductor films 103 shown in FIG. 9A, surfaces of the semiconductor films 103 may be flattened. The flattening is not always necessary; however, the flattening can improve the characteristics of an interface between each semiconductor film 103 and a gate insulating film in a transistor to be formed later. In specific, the flattening can be performed by chemical mechanical polishing (CMP), liquid jet polishing, or the like. The semiconductor films 103 are thinned by the flattening. The flattening may be performed on the semiconductor films 103a to 103d formed by the etching or on the semiconductor films 103 before the etching.

Alternatively, the semiconductor films can be attached to the base substrate so that the surfaces of the semiconductor films that are exposed due to the separation are in contact with the gate insulating film. However, when the surfaces of the semiconductor films that are exposed due to the separation face the base substrate as shown in this embodiment mode, the interface state density between the semiconductor films and the gate insulating film can be decreased and moreover homogenized because the surfaces which are flatter are in contact with the gate insulating film. Therefore, polishing performed for flattening the surfaces of the semiconductor films which are in contact with the gate insulating film can be omitted or the time of the polishing can be shortened, whereby cost can be suppressed and throughput can be improved.

The semiconductor films 103a to 103d or the semiconductor films 103 before performing the etching thereon may be irradiated with an energy beam for crystal defect recovery. As the energy beam, a beam selectively absorbed in a semiconductor, such as a laser beam, is desirably used. As the laser beam, a laser beam emitted from a light source such as a gas laser like an excimer laser or a solid-state laser like a YAG laser can be used. The laser beam preferably has a wavelength of ultraviolet to near-infrared light; specifically, the laser beam desirably has a wavelength of 190 nm to 2000 nm. Alternatively, flash lamp annealing by a halogen lamp, a xenon lamp, or the like may be used for crystal defect recovery.

Although this embodiment mode describes the case where a Smart Cut (registered trademark) method is used by which the semiconductor films 103 are separated from the single-crystal semiconductor substrate 100 by the formation of the defect layer 102, another bonding method such as ELTRAN (epitaxial layer transfer), a dielectric isolation method, or a PACE (plasma assisted chemical etching) method may alternatively be used.

With the semiconductor films 103a to 103d formed through the above steps, a variety of semiconductor elements such as thin film transistors 111 to 114 shown in FIG. 9C can be formed. It is to be noted that the thin film transistors 111 to 114 are provided to form the driver circuit of the display device over the base substrate in such a state that the thin film transistors are arranged in plural lines each line corresponding to the length of the driver circuit in the longitudinal direction.

Figure 3:
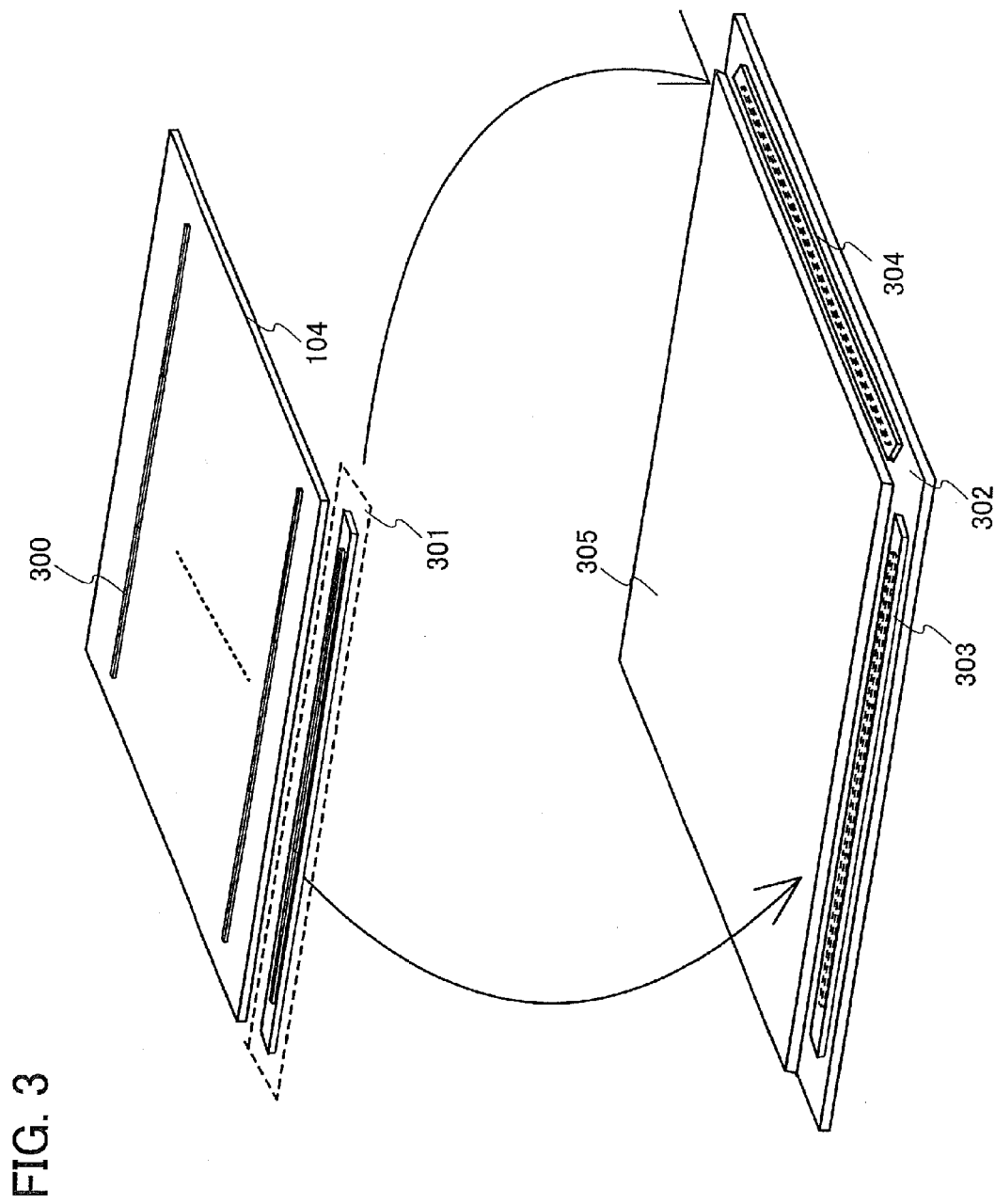
FIG. 3 is a drawing for describing Embodiment Mode 1.

Next, with reference to FIG. 3, description is made of how to mount driver circuits formed by the semiconductor films 201 provided over the base substrate 104 shown in FIG. 2. Each driver circuit 300, including the transistors formed using the semiconductor films 201 over the base substrate 104 shown in FIG. 3, are arranged in the longitudinal direction in accordance with the length of each driver circuit of the display device and divided into strips. Thus, stick-form driver circuits (hereinafter referred to as stick drivers 301) which serve as a scanning line side driver circuit and a signal line side driver circuit are manufactured. The dividing of the driver circuits 300 over the base substrate 104 into stripe forms (an elongated form)for manufacturing the stick drivers 301 can be performed by a cutting apparatus such as a dicer or a wire saw, laser cutting, plasma cutting, electron beam cutting, or any other cutting means.

Each of the stick drivers 301 divided into a stripe form from the base substrate 104 is provided at an edge portion of a substrate 302 having an insulating surface over which a pixel portion is formed. In this manner, each stick driver 301 is mounted as a scanning line side driver circuit 303 or a signal line side driver circuit 304. Then, a counter substrate 305 is provided so as to cover a region of the substrate 302 having the insulating surface, which excludes the scanning line side driver circuit 303 and the signal line side driver circuit 304. The stick drivers 301 and the substrate 302 may be connected to each other by fixing them with use of an adhesive. The stick drivers 301 may be fixed to the substrate 302 in such a manner that surfaces thereof provided with the driver circuits 300 face the substrate 302 or the surfaces thereof provided with the driver circuits 300 face in a direction opposite to the substrate 302. However, it is preferable that the surfaces provided with the driver circuits 300 face the substrate 302 because their electrical connection with the substrate 302 is easier.

Figures 4A, 4B, 4C:
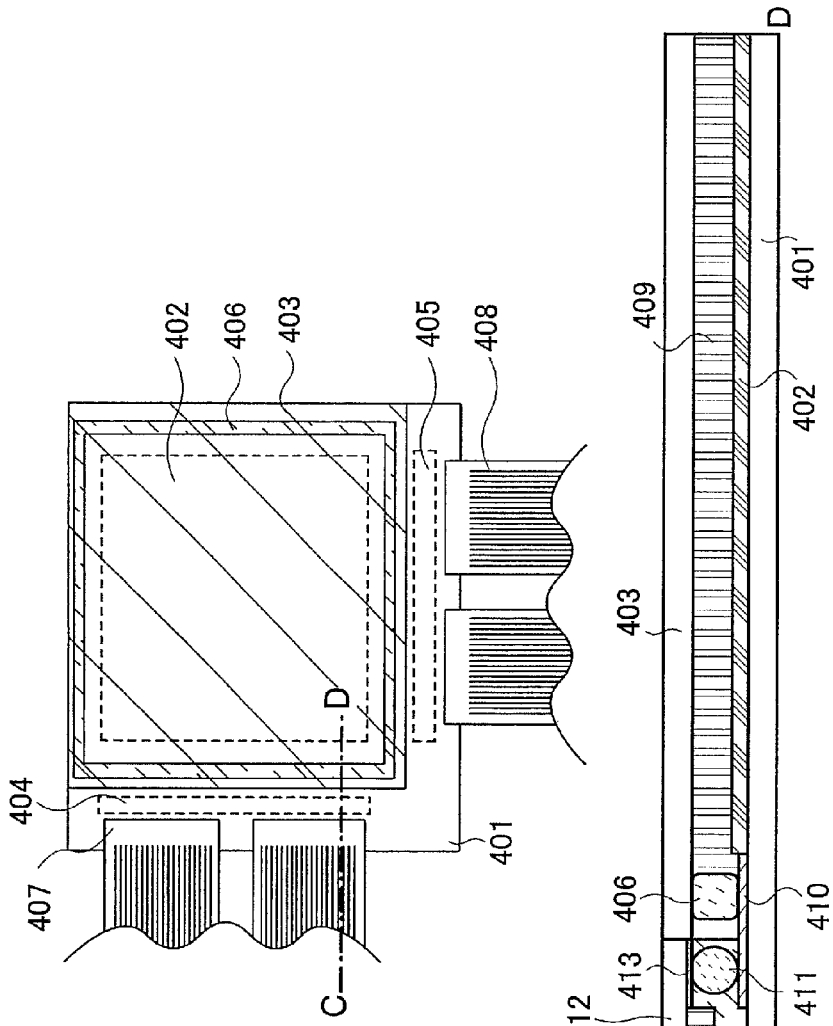
FIGS. 4A to 4C are drawings for describing Embodiment Mode 1.

FIG. 4A is a top view of a display device with the scanning line side driver circuit 303 and the signal line side driver circuit 304 mounted. FIGS. 4B and 4C are cross-sectional views of the display device. Description of the display device is made with reference to these drawings.

In FIG. 4A, a substrate 401 having an insulating surface, and a pixel portion 402 including TFTs, a counter substrate 403, a scanning line side driver circuit 404, and a signal line side driver circuit 405 which are formed over the substrate 401 having the insulating surface are provided. The pixel portion 402 is sealed by a sealant 406 between the substrate 401 having the insulating surface and the counter substrate 403. Moreover, FPCs 407 and FPCs 408 are provided in connection with the scanning line side driver circuit 404 and the signal line side driver circuit 405, respectively.

An example of a cross-sectional structure along C-D of FIG. 4A is shown in FIG. 4B, description of which is hereinafter made. Over the substrate 401, the pixel portion 402 having thin film transistors and pixel electrodes, the counter substrate 403, and a display element layer 409 provided with a liquid crystal element, an EL element, or the like sandwiched between the substrate 401 and the counter substrate 403 are provided. The display element layer 409 is isolated by the sealant 406 from the outside of the counter substrate 403. The pixel portion 402 is connected to a leading terminal 410 through which an image signal and a power supply voltage are input. In addition, the stick driver on a base substrate 412 divided into a stripe form described using FIG. 3 is provided as the scanning line side driver circuit 404. The scanning line side driver circuit 404 is provided with a leading terminal 413 for connection with the pixel portion 402 and an external circuit. The elements on the substrate 401 side and the scanning line side driver circuit 404 are electrically connected to each other in such a manner that the leading terminal 410 and the leading terminal 413 are electrically connected by spherical conductive members 411 (also called conductive particles). Moreover, the leading terminal 414 is connected to the FPCs 407 through which video signals, clock signals, and the like are input from external circuits.

As aforementioned, the stick driver including the driver circuit described in this embodiment mode can be provided in accordance with the size of the pixel portion; therefore, it is not necessary to arrange wirings led from a plurality of IC chips to drive scanning lines or signal lines for pixel driving, which is different from in a COG method. Accordingly, in the display device including the driver circuit described in this embodiment mode and an electronic appliance including the display device, the width of each frame region can be decreased. The stick driver including the driver circuit described in this embodiment mode is formed using a thin film transistor which uses a semiconductor film obtained from a single-crystal semiconductor substrate. Therefore, a display device including a driver circuit which is capable of high-speed operation and which is not affected by variation in transistor characteristics and an electronic appliance including the display device can be obtained. Moreover, the increase in area of the frame region due to the increase in size and definition of the display device can be suppressed; therefore, the display device and the electronic appliance provided with the display device can each have a smaller size.

The driver circuit capable of high-speed operation refers to a driver circuit capable of driving at a certain frequency or higher. For example, a circuit which operates at a frequency of 1 MHz or more is given. A semiconductor layer which is used is determined by a required frequency because the frequency at which a switching element used for a circuit can operate largely depends on a semiconductor material. A switching element which uses a single-crystal semiconductor material having high carrier mobility (about 500 $cm^2/V \cdot s$ in a case of electrons in single-crystal silicon) has high signal-transmission speed and is suitable for a high-frequency operation. On the other hand, a switching element which uses a non-singlecrystal semiconductor material having low carrier mobility (about 1 cm²/V·s in a case of electrons in amorphous silicon) has low signal-transmission speed and is not suitable for a high-frequency operation. It is to be noted that an upper limit of frequencies at which a switching element can operate also depends on parameters other than the material (for example, a channel length or the like); therefore, it is difficult to determine a certain operation frequency or higher as a suitable frequency for high-speed operation. A frequency is shown here in accordance with performance as tentative standard, which is required for a driver circuit of a display device.

Moreover, FIG. 4C shows a cross-sectional structure along C-D of FIG. 4A, which is different from the structure shown in FIG. 4B. The cross-sectional structure of FIG. 4C is different from that of FIG. 4B in that a base substrate 416 is thin and a region where the substrate 401 overlaps with the base substrate 416 is thinner than a region where the substrate 401 overlaps with the counter substrate 403. When the base substrate 416 is thinner than the counter substrate 403 and the stick driver is mounted on the display device, a space is formed over the base substrate 416. The space obtained over the base substrate 416 has an advantageous effect of releasing heat generated when the driver circuit operates. Therefore, the reliability and lifetime of the driver circuit can be increased. Moreover, the heat generated when the driver circuit operates can be released by using the base substrate 412 formed of a material which has a high heat-releasing property. By the structure of releasing heat from the driver circuit with high efficiency, the reliability and lifetime of the driver circuit can be increased. It is preferable that a polycrystalline silicon substrate or a metal substrate including a stainless steel substrate be used as the base substrate because the heat diffusion can be promoted further.

Although the stick driver including the driver circuit is formed on one surface of the substrate in this embodiment mode, the present invention is not limited to this. For example, a display portion may be formed in such a manner that a non-single-crystal semiconductor layer is formed on one surface (front surface) of an insulating substrate and a driver circuit may be formed in such a manner that a stick driver is fixed to another surface (rear surface) of the insulating substrate. Such a structure allows the one surface of the insulating substrate to be wholly used as the display portion; therefore, the frame portion of the display device is very narrow, whereby a display plane can be used effectively. Moreover, when the driver circuit is formed using a single-crystal semiconductor layer, the operation speed which is necessary and sufficient for the driver circuit can be obtained. Here, the display portion of the front surface and the driver circuit portion of the rear surface are electrically connected to each other by an embedded wiring that penetrates through the insulating substrate or by an FPC.

The display device where the driver circuit of the present invention can be mounted includes the following in its category: liquid crystal display devices, light-emitting devices in each of which a light-emitting element typified by an organic light-emitting device (OLED) is provided in each pixel, DMDs (digital micromirror devices), PDPs (plasma display panels), FEDs (field emission displays), or other display devices in each of which a circuit element using a semiconductor film is included in a driver circuit.

(Embodiment Mode 2)

In this embodiment mode, description is made of a display device including a driver circuit of the present invention which is manufactured by a method different from the method of manufacturing the stick-form driver circuit described in the above embodiment mode.

Figure 5A:
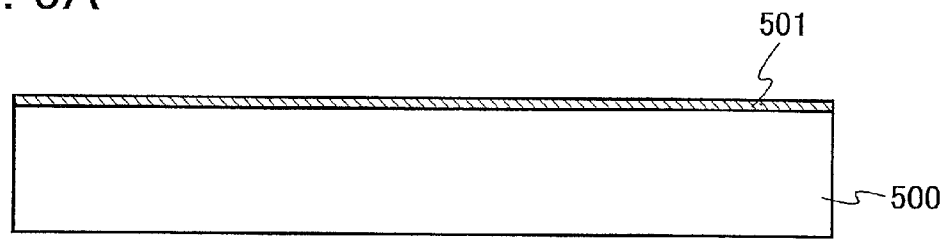
FIGS. 5A to 5D are drawings for describing Embodiment Mode 2.

First, as shown in FIG. 5A, an insulating film 501 is formed over a single-crystal semiconductor substrate 500. As the single-crystal semiconductor substrate 500, the same substrate as the single-crystal semiconductor substrate 100 described in Embodiment Mode 1 can be used.

As the insulating film 501, the same insulating film as the insulating film 101 described in Embodiment Mode 1 can be used. For example, in this embodiment mode, silicon oxide is used for the insulating film 501.

Figure 5B:
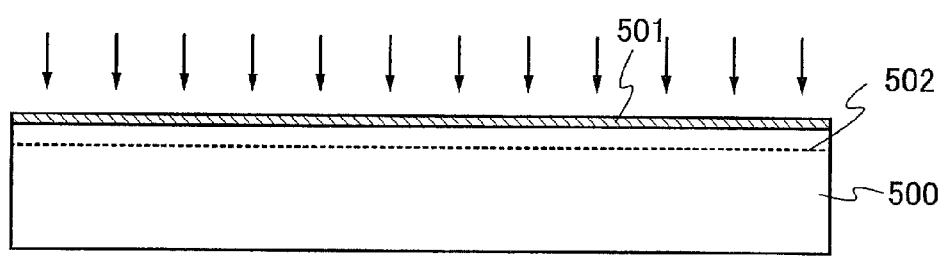

Next, as shown in FIG. 5B, hydrogen or a rare gas, or hydrogen ions or rare gas ions are introduced into the single-crystal semiconductor substrate 500 as indicated by arrows; thus, a defect layer 502 having very small voids is formed in a region at a predetermined depth from a surface of the single-crystal semiconductor substrate 500. The position where the defect layer 502 is formed depends on the acceleration voltage at the time of the above introduction. Moreover, the thickness of each of a semiconductor film 506 and a semiconductor film 508 which are formed from the single-crystal semiconductor substrate 500 is determined based on the position of the defect layer 502; therefore, the acceleration voltage at the time of the introduction is determined in consideration of the thicknesses of the semiconductor film 506 and the semiconductor film 508. The position of the defect layer 502 can be changed not only by the acceleration voltage at the time of the introduction but also by the film thickness of the insulating film 501. For example, when the insulating film 501 is formed to be thicker, each of the semiconductor film 506 and the semiconductor film 508 can be formed to be thinner. The thickness of each of the semiconductor film 506 and the semiconductor film 508 is set in the range of, for example, 10 nm to 200 nm, preferably 10 nm to 50 nm. For example, in a case of introducing hydrogen to the single-crystal semiconductor substrate 500, the dosage is desirably in the range of $1 \times 10^{16}/cm^2$ to $1 \times 10^{17}/cm^2$. In this embodiment mode, hydrogen or hydrogen ions are introduced under a condition where the dosage is $1.75 \times 10^{16}/cm^2$ and the acceleration voltage is 40 kV.

It is to be noted that the introduction of hydrogen or a rare gas, or hydrogen ions or rare gas ions into the single-crystal semiconductor substrate 500 at high concentration in the step of forming the defect layer 502 makes a surface of the single-crystal semiconductor substrate 500 rough in some cases. In such cases, the interface state density between the semiconductor film formed from the single-crystal semiconductor substrate 500 and a gate insulating film in contact with the semiconductor film varies. With the provision of the insulating film 501, however, the surface of the single-crystal semiconductor substrate 500 can be protected at the time of introducing hydrogen or a rare gas, or hydrogen ions or rare gas ions. Therefore, it is possible to prevent the surface of the single-crystal semiconductor substrate 500 from getting rough and to prevent the interface state density from varying.

Figure 5C:
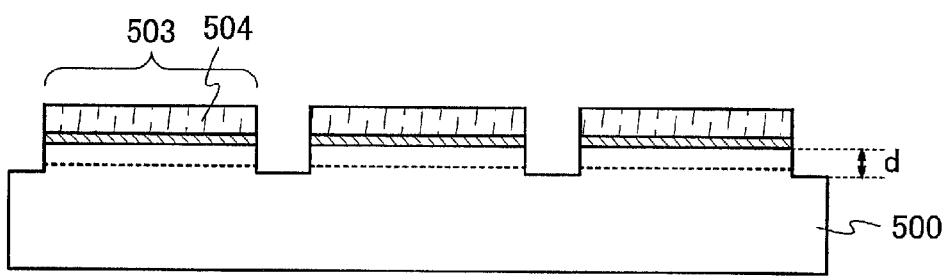

Next, the single-crystal semiconductor substrate 500 is partly removed. In this embodiment mode, the single-crystal semiconductor substrate 500 is partly etched away together with the insulating film 501 by using a mask 504 as shown in FIG. 5C; thus, the single-crystal semiconductor substrate 500 has a plurality of projections 503.

In the single-crystal semiconductor substrate 500, the width d of each projection 503 in a direction (a depth direction) perpendicular to the single-crystal semiconductor substrate 500 is equal to or larger than the depth of the defect layer 502. The width d of each projection 503 in the direction (the depth direction) perpendicular to the single-crystal semiconductor substrate 500 is not necessarily constant and may have different values depending on the location. In specific, the width d may be set to be, for example, 10 nm or more, preferably 200 nm or more in consideration of the thickness of the semiconductor film 506.

It is to be noted that the single-crystal semiconductor substrate 500 warps, bends, or has a slightly rounded edge in some cases. Moreover, when hydrogen or a rare gas, or hydrogen ions or rare gas ions are introduced in order to separate the semiconductor film from the single-crystal semiconductor substrate 500, the introduction of the above gas or ions cannot be performed sufficiently at an edge of the single-crystal semiconductor substrate 500 in some cases. In those cases, it is difficult to separate a part of the semiconductor film that is located at the edge of the single-crystal semiconductor substrate 500. Therefore, the plural projections 503 of the single-crystal semiconductor substrate 500 are desirably formed at a predetermined distance from a rim of the single-crystal semiconductor substrate 500. When the projections 503 are formed at a predetermined distance from the rim of the single-crystal semiconductor substrate 500, the formation of the semiconductor films by separation can be performed in a reproducible manner. For example, the distance between the projection 503 closest to the edge and the rim of the single-crystal semiconductor substrate 500 is preferably several tens of micrometers to several tens of millimeters.

Subsequently, after removing the mask 504, heat treatment is performed. Then, very small voids adjacent to each other in the defect layer 502 are combined, whereby the very small voids increase in volume. As a result, the single-crystal semiconductor substrate 500 is separated at the defect layer 502, so that the semiconductor film 506 used to serve as a part of the projection 503 is separated together with the insulating film 501 from the single-crystal semiconductor substrate 500. The heat treatment is preferably performed at temperatures in the range of 400° C. to 600° C.

The heat treatment may be performed by dielectric heating with use of a high-frequency wave such as a microwave. The heat treatment by the dielectric heating can be performed by irradiating the single-crystal semiconductor substrate 500 with a high-frequency wave generated by a high-frequency wave generator, which has a frequency in the range of 300 MHz to 3 THz. In specific, for example, the single-crystal semiconductor substrate 500 is irradiated with a microwave with a frequency of 2.45 GHz at 900 W for 14 minutes so that the very small voids adjacent to each other in the defect layer are combined, whereby the single-crystal semiconductor substrate 500 is separated finally.

Figure 5D:
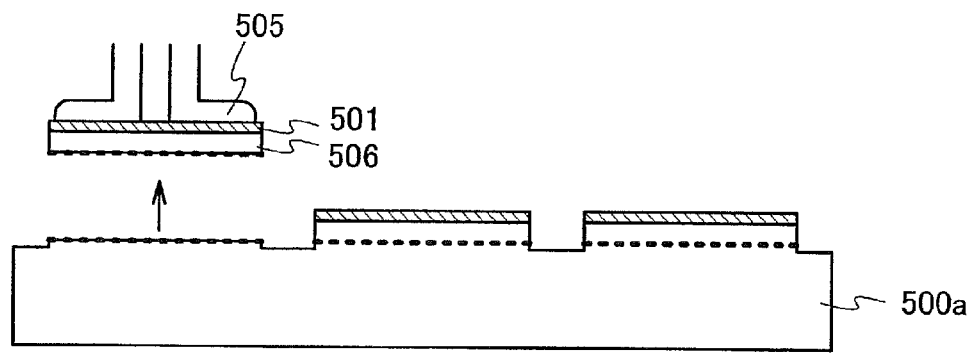

Then, a collect 505 is fixed to the insulating film 501 formed over the semiconductor film 506, as shown in FIG. 5D. The semiconductor film 506 is separated from the single-crystal semiconductor substrate 500 with use of the collect 505. Even if the separation of the single-crystal semiconductor substrate 500 by the aforementioned heat treatment is imperfect, the semiconductor film 506 can be completely separated from the single-crystal semiconductor substrate 500 by addition of force with the collect 505. As the collect 505, the following means which can selectively be fixed to one projection 503 is used: a chuck such as a vacuum chuck or a mechanical chuck, a microneedle with its tip having an adhesive, or the like. FIG. 5D illustrates an example of using a vacuum chuck as the collect 505.

As the adhesive which the microneedle has, an epoxy-based adhesive, a ceramic-based adhesive, a silicone-based adhesive, a low-temperature coagulant, or the like can be used. As the low-temperature coagulant, for example, MW-1 (manufactured by Eminent Supply Corporation) can be used. MW-1 has a coagulant point of 17° C. and has an adhesive effect at temperatures below 17° C. (preferably 10° C. or lower) and does not have an adhesive effect at temperatures of 17° C. or higher (preferably about 25° C.).

The single-crystal semiconductor substrate 500 may be subjected to hydrogenation treatment before the single-crystal semiconductor substrate 500 is separated. The hydrogenation treatment is performed, for example, at 350° C. for about two hours in a hydrogen atmosphere.

Figure 6A:
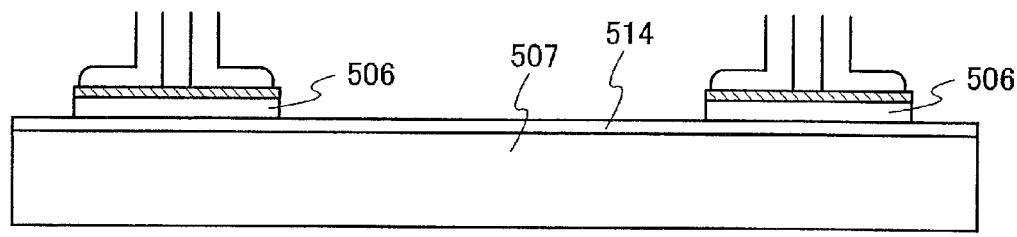
FIGS. 6A to 6C are drawings for describing Embodiment Mode 2.

Next, as shown in FIG. 6A, the semiconductor film 506 and a base substrate 507 are attached to each other so that a surface of the semiconductor film 506 that is exposed due to the separation faces the base substrate 507. In this embodiment mode, an insulating film 514 is formed over the base substrate 507. The semiconductor film 506 and the base substrate 507 can be attached to each other by attaching and bonding the insulating film 514 and the semiconductor film 506 to each other. After bonding the semiconductor film 506 and the insulating film 514 to each other, heat treatment is preferably performed at temperatures ranging from 400° C. to 600° C. in order to strengthen the bonding further.

Since the bonding is formed by Van der Vaals force, firm bonding can be obtained even at room temperature. It is to be noted that a substrate similar to the base substrate 104 described in Embodiment Mode 1 can be used as the base substrate 507. Moreover, a variety of substrates can be used as the base substrate 507.

It is to be noted that the base substrate 507 is not necessarily provided with the insulating film 514 on its surface. Even when the insulating film 514 is not formed, it is possible to bond the base substrate 507 and the semiconductor film 506 to each other. However, the formation of the insulating film 514 on the surface of the base substrate 507 can prevent impurities such as an alkali metal and an alkaline earth metal in the base substrate 507 from entering the semiconductor film 506.

In the case of forming the insulating film 514, not the base substrate 507 but the insulating film 514 is bonded to the semiconductor film 506; therefore, a wider variety of substrates can be used as the base substrate 507. In general, the upper temperature limits of substrates formed of flexible synthetic resins such as plastics tend to be low. However, as long as the substrates can resist process temperatures in manufacturing steps, the substrates formed of such resins can be used as the base substrate 507 in the case of forming the insulating film 514. In addition, polyesters typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like can be used as the plastic substrate.

Before or after attaching the semiconductor film 506 to the base substrate 507, the surface of the semiconductor film 506 that is exposed due to the separation may be subjected to thermal annealing by laser irradiation. When the thermal annealing is performed before the semiconductor film 506 is attached to the base substrate 507, the surface exposed due to the separation is flattened so that the bonding strength can be increased further. On the other hand, when the thermal annealing is performed after the semiconductor film 506 is attached to the base substrate 507, the semiconductor film 506 is partly melted so that the bonding strength can be increased further.

In the case of performing the thermal annealing by laser irradiation, it is desirable to use a fundamental-wave laser beam or a second-harmonic laser beam of a solid-state laser, which is selectively absorbed in a semiconductor. For example, a laser beam with an output power of 100 W emitted from a continuous-wave YAG laser is used. Then, the laser beam is preferably shaped by an optical system so that the laser beam has a rectangular or elliptical shape on an irradiation surface, and the rectangular or elliptical laser beam is delivered to the surface of the semiconductor film 506 which is exposed due to the separation. At this time, the power density needs to be in the range of about 1 kW/cm$^2$ to 100 MW/cm$^2$ (preferably 0.1 MW/cm$^2$ to 10 MW/cm$^2$) and the scanning speed is set in the range of about 10 cm/s to 2000 cm/s; thus, the irradiation is performed.

As a continuous-wave gas laser, an Ar laser, a Kr laser, or the like can be used. As a continuous-wave solid-state laser, a YAG laser, a YVO$_4$ laser, a YLF laser, a YAlO$_3$ laser, a forsterite (Mg$_2$SiO$_4$) laser, a GdVO$_4$ laser, a Y$_2$O$_3$ laser, a glass laser, a ruby laser, an alexandrite laser, a Ti:sapphire laser, or the like can be used. As a pulsed laser, an Ar laser, a Kr laser, an excimer laser, a CO$_2$ laser, a YAG laser, a Y$_2$O3 laser, a YVO$_4$ laser, a YLF laser, a YAlO$_3$ laser, a glass laser, a ruby laser, an alexandrite laser, a Ti:sapphire laser, a copper vapor laser, or a gold vapor laser can be used, for example.

The semiconductor film 506 may be attached to the base substrate 507 by the following manner, instead of by just bonding the semiconductor film 506 to the base substrate 507: vibration at a high frequency of about 10 MHz to 1 THz is applied to the semiconductor film 506 to generate frictional heat between the semiconductor film 506 and the base substrate 507 so that the semiconductor film 506 is partly melted by the heat.

In the case of using MW-1 as the low-temperature coagulant, first, the low-temperature coagulant at a tip of the microneedle is disposed in contact with the insulating film 501 over the projection 503 at a temperature (for example, about 25° C.) at which the low-temperature coagulant does not has an adhesive effect. Next, the temperature is decreased to a temperature (for example, about 5° C.) at which the low-temperature coagulant has an adhesive effect so that the low-temperature coagulant is coagulated. Thus, the microneedle and the insulating film 501 over the projection 503 are fixed to each other. Subsequently, the semiconductor film 506 separated from the single-crystal semiconductor substrate 500 is attached to the base substrate 507 and the temperature of the low-temperature coagulant is then increased again up to the temperature (for example, about 25° C.) at which the low-temperature coagulant does not have an adhesive effect. As a result, the microneedle can be separated from the semiconductor film 506.

Figure 6B:
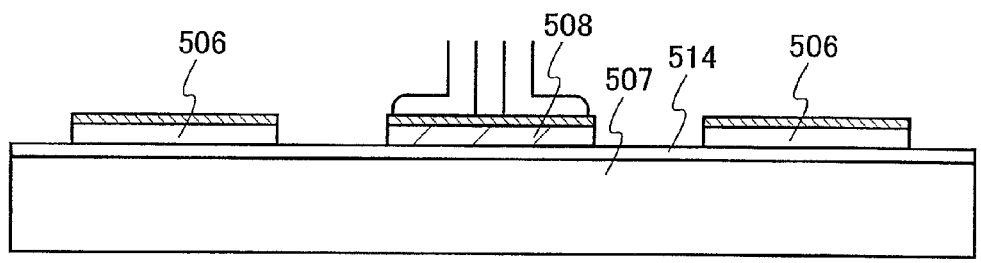

Next, as shown in FIG. 6B, in a manner similar to the semiconductor film 506, the semiconductor film 508 is separated from a single-crystal semiconductor substrate having a different crystal plane orientation from the single-crystal semiconductor substrate 500 which forms the semiconductor film 506 and attached to the base substrate 507.

The mobility of majority carriers in a semiconductor depends on crystal plane orientation. Therefore, the semiconductor film 506 or the semiconductor film 508 may be formed by selecting as appropriate a single-crystal semiconductor substrate which has crystal plane orientation suitable for a semiconductor element to be formed. For example, in a case of forming an n-type semiconductor element by using the semiconductor film 506, the mobility of majority carriers in the semiconductor element can be increased by forming the semiconductor film 506 which has a {100} plane. Moreover, in a case of forming a p-type semiconductor element by using the semiconductor film 508, the mobility of majority carriers in the semiconductor element can be increased by forming the semiconductor film 508 which has a {110} plane. Further, in a case of forming a transistor as the semiconductor element, a direction of attaching the semiconductor film 506 or the semiconductor film 508 is determined in consideration of a channel direction and crystal plane orientation.

As described above, the single-crystal semiconductor substrate warps, bends, or has a round end in some cases. Moreover, when hydrogen or a rare gas, or hydrogen ions or rare gas ions are introduced in order to separate the semiconductor film from the single-crystal semiconductor substrate, the introduction of the above gas or ions cannot be performed sufficiently at an end of the single-crystal semiconductor substrate in some cases. In those cases, it is difficult to separate a part of the semiconductor film that is located at the end of the single-crystal semiconductor substrate. In a case of forming the semiconductor films by separating the single-crystal semiconductor substrate after the single-crystal semiconductor substrate is attached to the base substrate, the distance between the semiconductor films is several millimeters to several centimeters. However, in the present invention, the semiconductor film 506 and the semiconductor film 508 are formed by separating the single-crystal semiconductor substrates before the single-crystal semiconductor substrates are attached to the base substrate 507. Accordingly, when the semiconductor film 506 and the semiconductor film 508 are attached to the base substrate 507, the distance between the semiconductor film 506 and the semiconductor film 508 can be made as small as several tens of micrometers. Thus, a driver circuit of a display device can be manufactured easily even over the space between the semiconductor film 506 and the semiconductor film 508.

Figure 7:
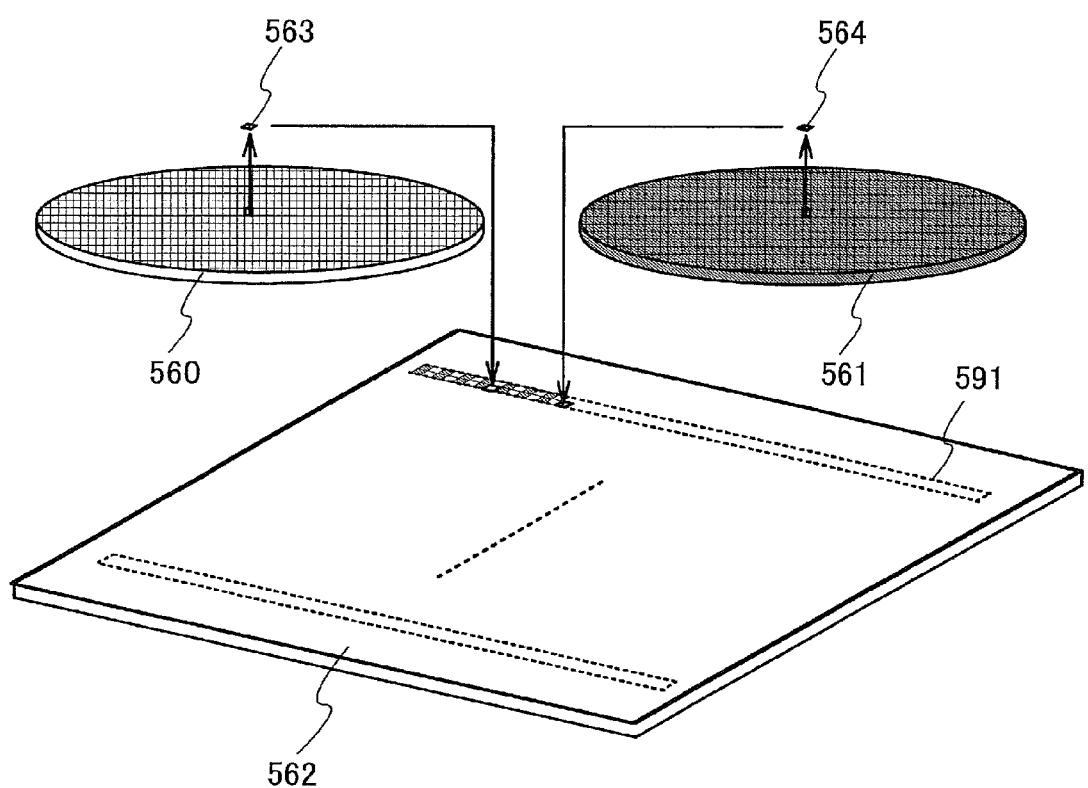
FIG. 7 is a drawing for describing Embodiment Mode 2.

In FIG. 7, semiconductor films 563 (also referred to as first semiconductor films) and semiconductor films 564 (also referred to as second semiconductor films) are separated from a single-crystal semiconductor substrate 560 (also referred to as a first single-crystal semiconductor substrate) and a single-crystal semiconductor substrate 561 (also referred to as a second single-crystal semiconductor substrate), respectively and the semiconductor films 563 and the semiconductor films 564 are attached to a base substrate 562. The single-crystal semiconductor substrate 560 and the single-crystal semiconductor substrate 561 have different crystal plane orientation from each other. The positions on the base substrate 562 where the semiconductor films 563 and the semiconductor films 564 are attached can be determined based on the information from a mask drawing of a semiconductor element. Although FIG. 7 shows an example of separating the semiconductor films 563 and the semiconductor films 564 from the two single-crystal semiconductor substrates 560 and 561, the number of single-crystal semiconductor substrates may be three or more. It is to be noted that the plural semiconductor films 563 and the plural semiconductor films 564 are arranged in a longitudinal direction of the driver circuit of the display device in accordance with the length of the driver circuit as described in Embodiment Mode 1 with reference to FIG. 2. In FIG. 7, the plural semiconductor films 563 and 564 are provided in a region 591 over the base substrate 562 so that the driver circuit can be manufactured in accordance with the panel size of a large-sized display device. As a result, it is not necessary to mount a plurality of driver ICs in accordance with the panel size of a large-sized display device differently from in a COG method. Thus, the area of a frame region which used to be large due to leading of wirings can be narrowed and a driver circuit with less variation in transistor characteristics can be manufactured by using the semiconductor films formed from the single-crystal semiconductor substrates.

Figure 6C:
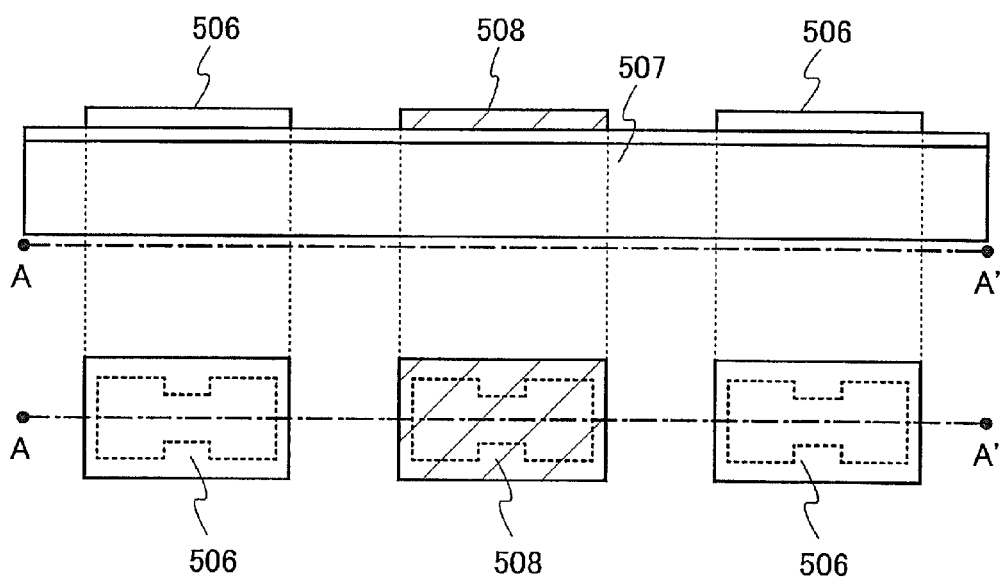

Next, as shown in FIG. 6C, the insulating film 501 formed over the semiconductor film 506 and the semiconductor film 508 is removed. In FIG. 6C, a cross-sectional view of the semiconductor film 506 and the semiconductor film 508 and moreover a top view of the semiconductor film 506 and the semiconductor film 508 are shown. The cross-sectional view of FIG. 6C corresponds to a cross section along a dotted line A-A' of the top view.

Figure 8A:
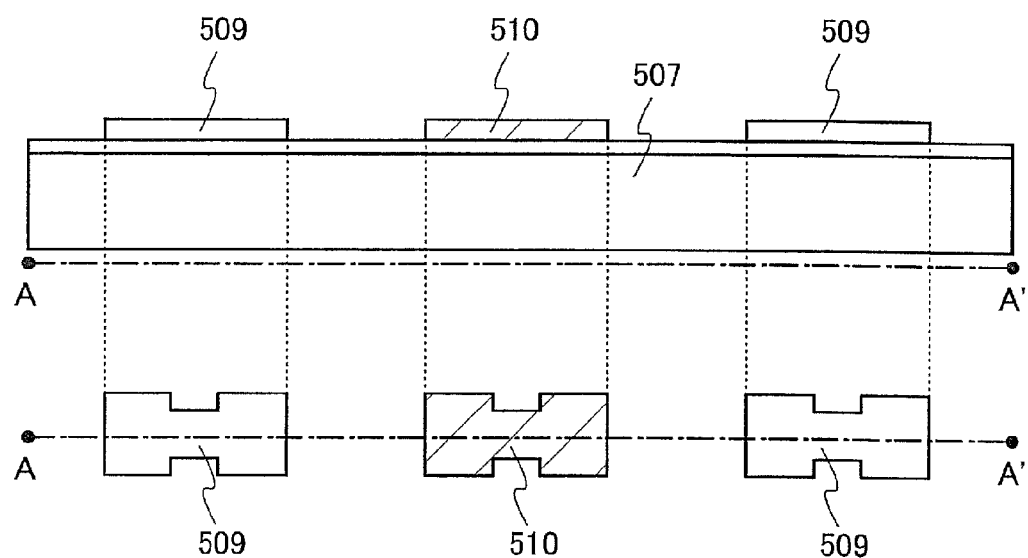
FIGS. 8A and 8B are drawings for describing Embodiment Mode 2.

Next, the semiconductor film 506 and the semiconductor film 508 are partly etched to form a semiconductor film 509 from the semiconductor film 506 and form a semiconductor film 510 from the semiconductor film 508, as shown in FIG. 8A. In FIG. 8A, a cross-sectional view of the semiconductor film 509 and the semiconductor film 510 and moreover a top view of the semiconductor film 509 and the semiconductor film 510 are shown. The cross-sectional view of FIG. 8A corresponds to a cross section along a dotted line A-A' of the top view. When the semiconductor film 506 and the semiconductor film 508 are further etched, ends of the semiconductor film 506 and the semiconductor film 508 where the bonding strength is not sufficient can be removed.

Although one semiconductor film 509 is formed by etching one semiconductor film 506 and one semiconductor film 510 is formed by etching one semiconductor film 508 in this embodiment mode, the present invention is not limited to this structure. For example, a plurality of semiconductor films 509 may be formed by etching one semiconductor film 506 and a plurality of semiconductor films 510 may be formed by etching one semiconductor film 508.

Figure 8B:
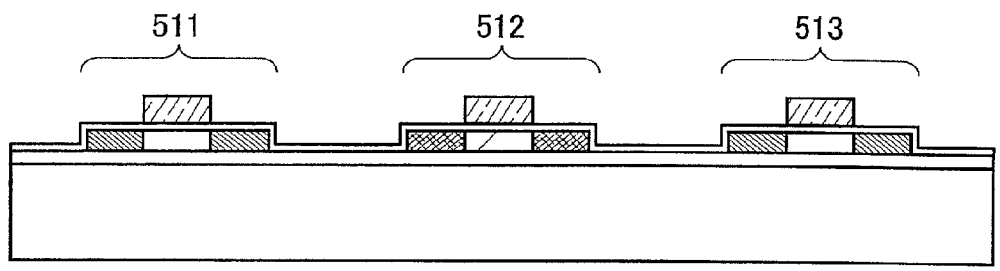

After forming the semiconductor film 509 and the semiconductor film 510 as shown in FIG. 8A, surfaces of the semiconductor film 509 and the semiconductor film 510 may be flattened as shown in FIG. 8B. The flattening is not always necessary. However, the flattening makes it possible to improve characteristics of an interface between a gate insulating film and each of the semiconductor film 509 and the semiconductor film 510 in transistors to be formed later. In specific, the flattening can be performed by chemical mechanical polishing (CMP), liquid jet polishing, or the like. The semiconductor film 509 and the semiconductor film 510 are thinned by the flattening. The flattening may be performed on the semiconductor films 509 and 510 formed by the etching or may be performed on the semiconductor films 506 and 508 before being etched.

The semiconductor films can alternatively be attached to the base substrate in such a manner that surfaces of the semiconductor films that are exposed due to the separation are in contact with the gate insulating film. However, when the surfaces of the semiconductor films that are exposed due to the separation face the base substrate as shown in this embodiment mode, the interface state density between the semiconductor films and the gate insulating film can be decreased and moreover homogenized because the surfaces which are flatter are in contact with the gate insulating film. Therefore, polishing performed for flattening the surfaces of the semiconductor films which are in contact with the gate insulating film can be omitted or the time of the polishing can be shortened, whereby cost can be suppressed and throughput can be improved.

Moreover, the semiconductor films 509 and 510 or the semiconductor films 506 and 508 before being etched may be irradiated with an energy beam for crystal defect recovery. As the energy beam, a beam which is selectively absorbed in a semiconductor, such as a laser beam is desirably used. As a light source of the laser beam, a gas laser such as an excimer laser or a solid-state laser such as a YAG laser can be used. The laser beam preferably has a wavelength of ultraviolet to near-infrared light; specifically, the laser beam desirably has a wavelength of 190 nm to 2000 nm. Alternatively, flash lamp annealing which uses a halogen lamp, a xenon lamp, or the like may be used for crystal defect recovery.

Although this embodiment mode describes the case where a Smart Cut (registered trademark) method is used by which the semiconductor films 506 and 508 are separated from the single-crystal semiconductor substrates by the formation of the defect layer 502, another bonding method such as ELTRAN (epitaxial layer transfer), a dielectric isolation method, or a PACE (plasma assisted chemical etching) method may be used.

With the use of the semiconductor films 509 and 510 formed through the above steps, a variety of semiconductor elements such as thin film transistors 511 to 513 shown in FIG. 8B can be formed.

As for the driver circuit used for the display device described in this embodiment mode, the process can be performed at high throughput even when the substrate 507 has a large size. This is because the plural semiconductor films are attached to one base substrate by using the plural single-crystal semiconductor substrates. Moreover, since the plane orientation of the semiconductor film can be selected as appropriate in accordance with the polarity of the semiconductor element, the semiconductor element can have higher mobility and the driver circuit of the display device can operate at higher speed.

The driver circuit used for the display device described in this embodiment mode of the present invention is formed in such a manner that the plural semiconductor films 506 are formed by being separated from plural locations of the single-crystal semiconductor substrate 500 and the semiconductor films 506 are attached to the base substrate. Thus, the position where each semiconductor film 506 is attached can be selected in accordance with the polarity and layout of the semiconductor element in the semiconductor device.

Next, the driver circuit is mounted to the display device in a manner similar to the description of Embodiment Mode 1 on FIG. 3 and FIGS. 4A to 4C. As a result, the display device including the driver circuit of the present invention can be obtained. Similar to Embodiment Mode 1, the stick driver including the driver circuit described in this embodiment mode can be provided in accordance with the size of a pixel portion; therefore, it is not necessary to arrange wirings led from a plurality of IC chips to drive scanning lines or signal lines for pixel driving, which is different from in a COG method. Therefore, the widths of frame regions of a display device including the driver circuit described in this embodiment mode and an electronic appliance including the display device can be narrowed. The stick driver including the driver circuit described in this embodiment mode has the thin film transistor using the semiconductor film obtained from the single-crystal semiconductor substrate. Therefore, a display device which includes the driver circuit capable of high-speed operation and which is not affected by variation in transistor characteristics and an electronic appliance including the display device can be obtained. Moreover, the increase in area of a frame region due to the increase in size and definition of a display device can be suppressed; therefore, a display device and an electronic appliance provided with the display device can each have a smaller size.

The display device where the driver circuit can be mounted in the present invention includes the following in its category: liquid crystal display devices, light-emitting devices in each of which a light-emitting element typified by an organic light-emitting device (OLED) is provided in each pixel, DMDs (digital micromirror devices), PDPs (plasma display panels), FEDs (field emission displays), or other display devices in each of which a circuit element using a semiconductor film is included in a driver circuit.

This embodiment mode can be implemented in combination with the above embodiment mode as appropriate.

[Embodiment 1]

In this embodiment, an inverter is described as an example of specific structures of a variety of circuits in a driver circuit of a display device of the present invention. A circuit diagram of the inverter is shown in FIG. 10A, and a top view of the inverter of FIG. 10A is shown in FIG. 10B, as an example.

Figure 10A:
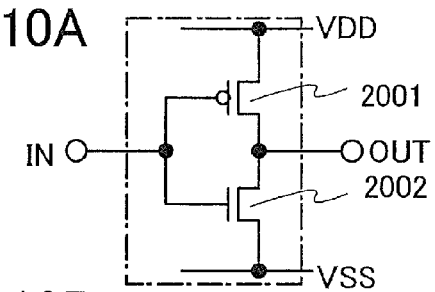
FIGS. 10A to 10D are drawings for describing an embodiment of the present invention.
Figure 10B:
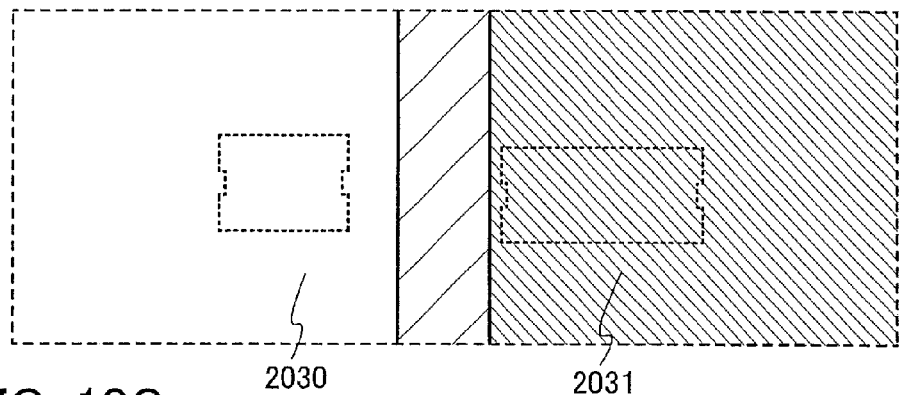

The inverter shown in FIG. 10A has a p-channel transistor 2001 and an n-channel transistor 2002. The transistor 2001 and the transistor 2002 are connected in series. In specific, a drain of the transistor 2001 is connected to a drain of the transistor 2002. The potentials of the drain of the transistor 2001 and the drain of the transistor 2002 are applied to an output terminal OUT.

Further, a gate of the transistor 2001 is connected to a gate of the transistor 2002. The potential of a signal input to an input terminal IN is applied to the gate of the transistor 2001 and the gate of the transistor 2002. A high-level voltage VDD is applied to a source of the transistor 2001 while a low-level voltage VSS is applied to a source of the transistor 2002.

Figure 10C:
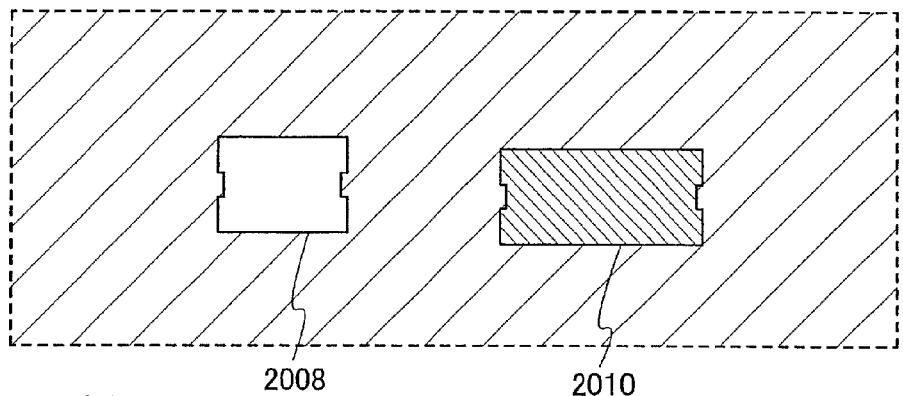

The inverter shown in FIG. 10A is formed by the method of manufacturing the driver circuit described in Embodiment Mode 2 of the present invention. That is to say, a semiconductor film 2030 whose crystal plane orientation is {100} and a semiconductor film 2031 whose crystal plane orientation is {110} are attached to a base substrate, as shown in FIG. 10B. Next, the semiconductor film 2030 is partly etched to form a semiconductor film 2008 and the semiconductor film 2031 is partly etched to form a semiconductor film 2010, as shown in FIG. 10C.

Figure 10D:
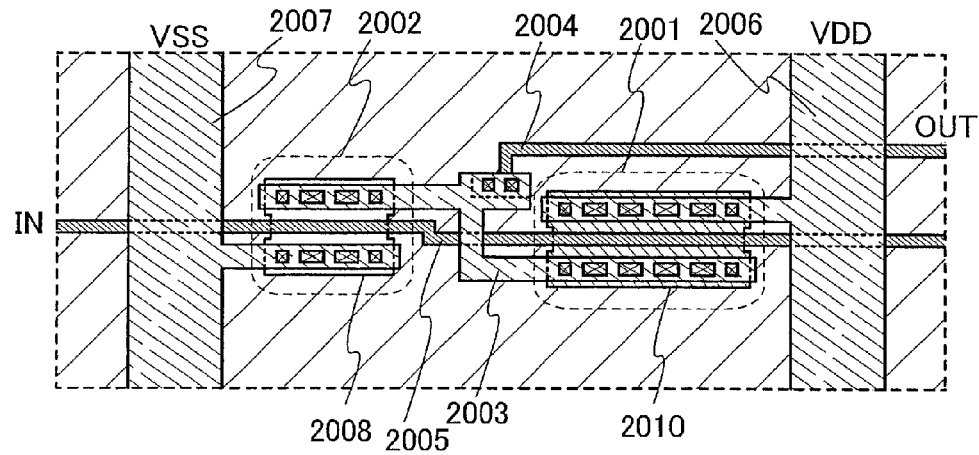

Then, the n-channel transistor 2002 is formed using the semiconductor film 2008 and the p-channel transistor 2001 is formed using the semiconductor film 2010, whereby the inverter can be formed as shown in FIG. 10D.

Specifically, in the inverter shown in FIG. 10D, the drain of the transistor 2001 and the drain of the transistor 2002 are electrically connected to each other through a wiring 2003. The wiring 2003 is connected to a wiring 2004. Therefore, the potentials of the drain of the transistor 2001 and the drain of the transistor 2002 are applied as the potential of the output terminal OUT to a circuit in the next stage through the wiring 2003 and the wiring 2004.

Further, in the inverter shown in FIG. 10D, parts of a wiring 2005 function as the gate of the transistor 2001 and the gate of the transistor 2002. The potential applied to the wiring 2005 is applied to the gate of the transistor 2001 and the gate of the transistor 2002 as the potential of the input terminal IN. The voltage VDD is applied to the source of the transistor 2001 through a wiring 2006 and the voltage VSS is applied to the source of the transistor 2002 through a wiring 2007.

This embodiment can be implemented in combination with any of the above embodiment modes as appropriate.

[Embodiment 2]

In this embodiment, a NAND is described as an example of specific structures of a variety of circuits in a driver circuit of a display device of the present invention. A circuit diagram of the NAND is shown in FIG. 11A, and a top view of the NAND of FIG. 11A is shown in FIG. 11B, as an example.

Figure 11A:
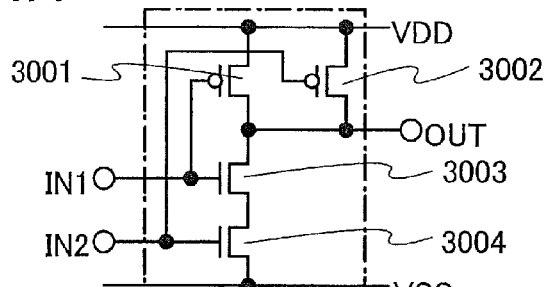
FIGS. 11A to 11D are drawings for describing an embodiment of the present invention.
Figure 11B:
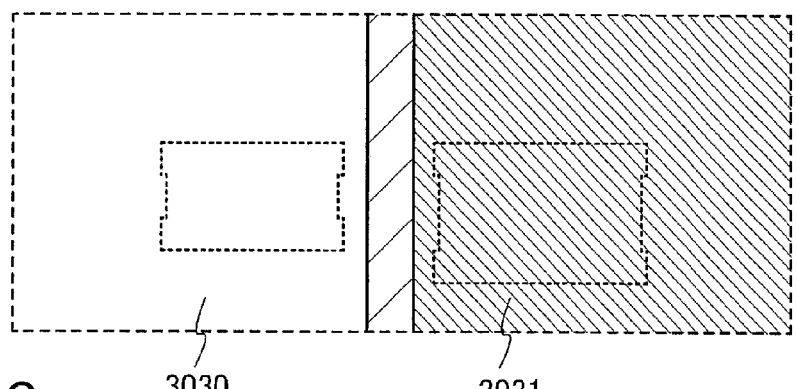

The NAND shown in FIG. 11A has a p-channel transistor 3001, a p-channel transistor 3002, an n-channel transistor 3003, and an n-channel transistor 3004. The transistor 3001, the transistor 3003, and, the transistor 3004 are connected in series in that order. Meanwhile, the transistor 3001 and the transistor 3002 are connected in parallel.

In specific, a high-level voltage VDD is applied to one of a source and a drain of the transistor 3001, and the other of the source and the drain is connected to an output terminal OUT. The high-level voltage VDD is applied to one of a source and a drain of the transistor 3002 and the other is connected to the output terminal OUT. A low-level voltage VSS is applied to one of a source and a drain of the transistor 3004. One of a source and a drain of the transistor 3003 is connected to the output terminal OUT. Further, the other of the source and the drain of the transistor 3003 is connected to the other of the source and the drain of the transistor 3004. The potential of an input terminal IN1 is applied to a gate of the transistor 3001 and a gate of the transistor 3003. Further, the potential of an input terminal IN2 is applied to a gate of the transistor 3002 and a gate of the transistor 3004.

Figure 11C:
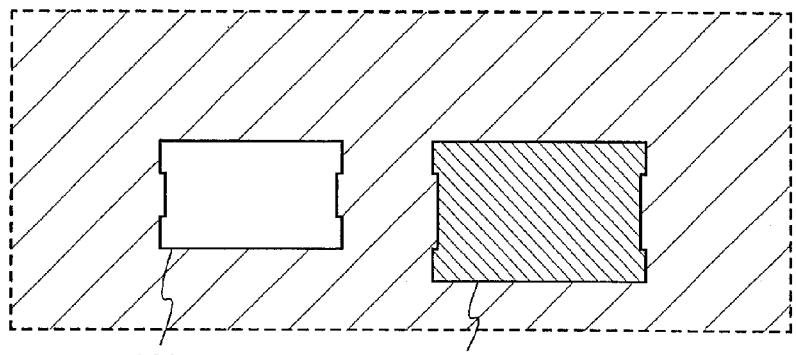

The NAND shown in FIG. 11A is formed by the method of manufacturing the driver circuit described in Embodiment Mode 2 of the present invention. That is to say, a semiconductor film 3030 whose crystal plane orientation is {100} and a semiconductor film 3031 whose crystal plane orientation is {110} are attached to a base substrate, as shown in FIG. 11B. Next, the semiconductor film 3030 is partly etched to form a semiconductor film 3006 and the semiconductor film 3031 is partly etched to form a semiconductor film 3005, as shown in FIG. 11C.

Figure 11D:
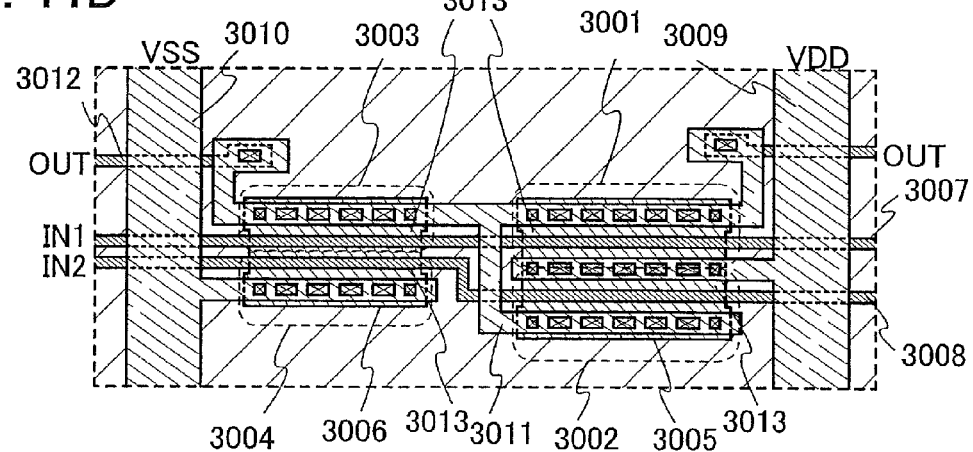

Then, the n-channel transistors 3003 and 3004 are formed using the semiconductor film 3006 and the p-channel transistors 3001 and 3002 are formed using the semiconductor film 3005, whereby the NAND can be formed as shown in FIG. 11D.

In the NAND shown in FIG. 11D, the parallel connected transistors 3001 and 3002 share the semiconductor film 3005. Moreover, the serially connected transistors 3003 and 3004 share the semiconductor film 3006. Further, parts of a wiring 3007 function as the gate of the transistor 3001 and the gate of the transistor 3003. Thus, the potential applied to the wiring 3007 is applied to the gate of the transistor 3001 and the gate of the transistor 3003 as the potential of the input terminal IN1. Parts of a wiring 3008 function as the gate of the transistor 3002 and the gate of the transistor 3004. The potential applied to the wiring 3008 is applied to the gate of the transistor 3002 and the gate of the transistor 3004 as the potential of the input terminal IN2.

The high-level voltage VDD is applied to one of the source and the drain of the transistor 3001 and one of the source and the drain of the transistor 3002 through a wiring 3009. Further, the low-level voltage VSS is applied to one of the source and the drain of the transistor 3004 through a wiring 3010. The potentials of the other of the source and the drain of the transistor 3001, the other of the source and the drain of the transistor 3002, and one of the source and the drain of the transistor 3003 are applied as the potential of the output terminal OUT to a circuit in the next stage through a wiring 3011 and a wiring 3012.

This embodiment can be implemented in combination with any of the above embodiment modes or embodiment as appropriate.

[Embodiment 3]

In this embodiment, a specific example of a method of manufacturing a thin film transistor used in the present invention is described.

Figure 12A:
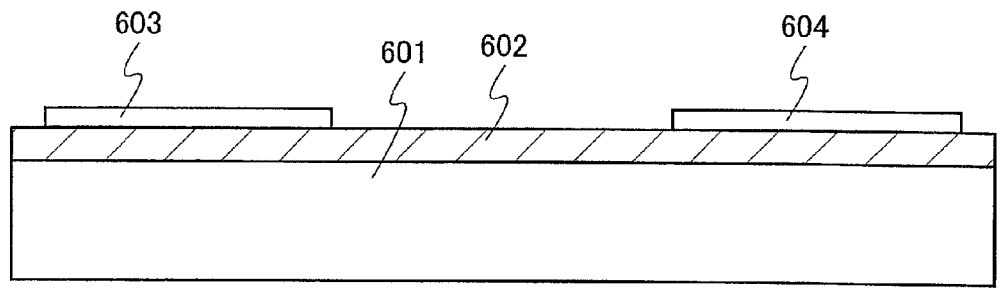
FIGS. 12A to 12D are drawings for describing an embodiment of the present invention.

First, a semiconductor film 603 which has a {100} plane and a semiconductor film 604 which has a {110} plane are formed over a base substrate 601, as shown in FIG. 12A. This embodiment shows an example in which an insulating film 602 is provided between the base substrate 601 and each of the semiconductor film 603 and the semiconductor film 604. The insulating film 602 may be formed by a single insulating film or a stack of plural insulating films.

An impurity may be added to the semiconductor film 603 and the semiconductor film 604 in order to control the threshold voltage. For example, in the case of adding boron as a p-type impurity, boron is preferably added at a concentration ranging from $5 \times 10^{17}$ cm$^{-3}$ to $1 \times 10^{18}$ cm$^{-3}$ inclusive. The addition of the impurity for controlling the threshold voltage may be performed either before or after the semiconductor films are attached to the base substrate 601.

Hydrogenation treatment may be performed after the semiconductor film 603 and the semiconductor film 604 are formed and before a gate insulating film 606 is formed. The hydrogenation treatment is performed, for example, at 350° C. for about two hours in a hydrogen atmosphere.

Figure 12B:
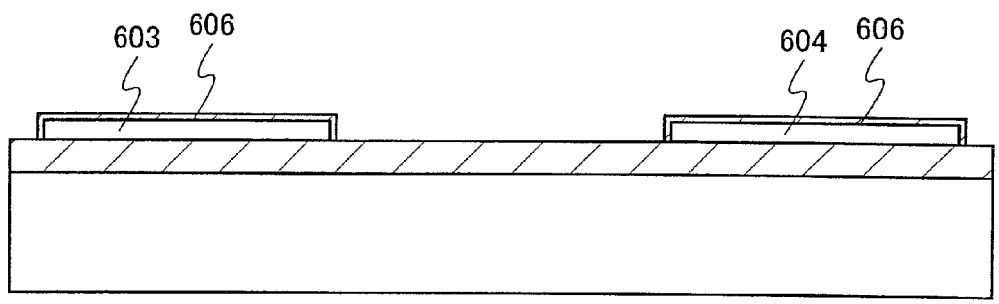

Next, the gate insulating film 606 is formed so as to cover the semiconductor film 603 and the semiconductor film 604, as shown in FIG. 12B. The gate insulating film 606 can be formed by oxidation or nitridation of surfaces of the semiconductor film 603 and the semiconductor film 604 through a high-density plasma treatment. The high-density plasma treatment is performed by using, for example, a mixed gas of a rare gas such as He, Ar, Kr, or Xe and any of oxygen, nitrogen oxide, ammonia, nitrogen, and hydrogen. In this case, plasma with low electron temperature and high density can be generated when plasma excitation is performed by introduction of a microwave. The surfaces of the semiconductor films are oxidized or nitrided by oxygen radicals (which include OH radicals in some cases) or nitrogen radicals (which include NH radicals in some cases) generated by such high-density plasma, whereby insulating films are formed to a thickness of 1 nm to 20 nm, desirably 5 nm to 10 nm so as to be in contact with the semiconductor films. The insulating film with a thickness of 5 nm to 10 nm is used as the gate insulating film 606.

The oxidation or nitridation of the semiconductor films by the above-described high-density plasma treatment is a solid-phase reaction; therefore, the interface state density between the gate insulating film 606 and each of the semiconductor film 603 and the semiconductor film 604 can be drastically decreased. Further, since the semiconductor films are directly oxidized or nitrided by the high-density plasma treatment, variation in thickness of the insulating film to be formed can be suppressed. Moreover, in the case where the semiconductor films have crystallinity, the surfaces of the semiconductor films are oxidized by the solid state reaction through the high-density plasma treatment, whereby rapid oxidation only at crystal grain boundaries can be suppressed and the gate insulating film with favorable uniformity and low interface state density can be formed. A transistor in which the insulating film formed by the high-density plasma treatment is used as part of the gate insulating film or as the whole gate insulating film can have less variation in characteristics.

Alternatively, the gate insulating film 606 may be formed by thermally oxidizing the semiconductor film 603 and the semiconductor film 604. Further alternatively, the gate insulating film 606 may be formed by a plasma CVD method, a sputtering method, or the like as a single layer or a stack of layers of a film including silicon oxide, silicon nitride oxide, silicon oxynitride, silicon nitride, hafnium oxide, aluminum oxide, or tantalum oxide.

Figure 12C:
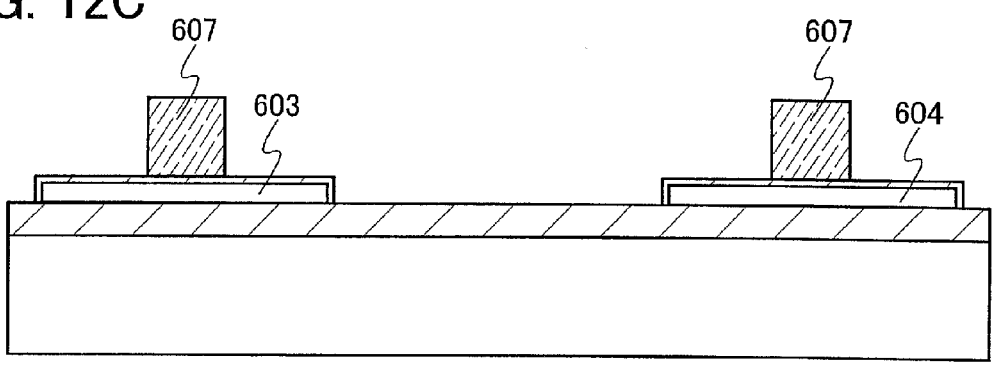

Next, as shown in FIG. 12C, a conductive film is formed over the gate insulating film 606 and the conductive film is then processed (patterned) into a predetermined shape, so that electrodes 607 are formed over the semiconductor films 603 and 604. A CVD method, a sputtering method, or the like can be used for forming the conductive film. Tantalum (Ta), tungsten (W), titanium (Ti), molybdenum (Mo), aluminum (Al), copper (Cu), chromium (Cr), niobium (Nb), or the like can be used for forming the conductive film. Alternatively, an alloy including the above-described metal as a main component or a compound including the above-described metal can also be used. Further alternatively, a semiconductor material such as polycrystalline silicon doped with an impurity element which imparts conductivity, such as phosphorus, may be used.

As a combination of two layers of the conductive film, tantalum nitride or tantalum (Ta) can be used for a first layer and tungsten (W) can be used for a second layer. Besides the above-described example, tungsten nitride and tungsten; molybdenum nitride and molybdenum; aluminum and tantalum; aluminum and titanium; and the like can be given. Tungsten and tantalum nitride have high heat resistance. Therefore, after the formation of the two layers of the conductive film, heat treatment may be performed for the purpose of thermal activation. Alternatively, as the combination of the two layers of the conductive film, for example, silicon doped with an impurity imparting n-type conductivity and nickel silicide, Si doped with an impurity imparting n-type conductivity and WSix, or the like can be used.

In addition, although each of the electrodes 607 is formed of a single-layer conductive film in this embodiment, this embodiment is not limited to this structure. Each of the electrodes 607 may be formed using a stack of plural conductive films. In the case of a three-layer structure in which three conductive films are stacked, a stacked-layer structure of a molybdenum film, an aluminum film, and a molybdenum film is preferably employed.

As a mask used for forming the electrodes 607, silicon oxide, silicon nitride oxide, or the like may be used instead of a resist. In this case, a step of forming the mask made of silicon oxide, silicon nitride oxide, or the like by patterning is added. However, the electrodes 607 with desired widths can be formed because decrease in film thickness and width of the mask at the time of etching is less than that in the case of using a resist mask. Alternatively, the electrodes 607 may be formed selectively by a droplet discharge method without using a mask.

It is to be noted that a droplet discharging method means a method by which droplets including a predetermined composition are discharged or ejected from small holes to form a predetermined pattern, and includes an ink-jet method and the like in its category.

The electrodes 607 can be formed in such a manner that the formed conductive film is etched into a desired tapered shape by an ICP (Inductively Coupled Plasma) etching method and controlling the etching condition (for example, the amount of electric power applied to a coiled electrode layer, the amount of electric power applied to an electrode layer on the substrate side, or the electrode temperature on the substrate side) as appropriate. In addition, an angle and the like of the tapered shape can also be controlled by the shape of the mask. For the etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 12D:
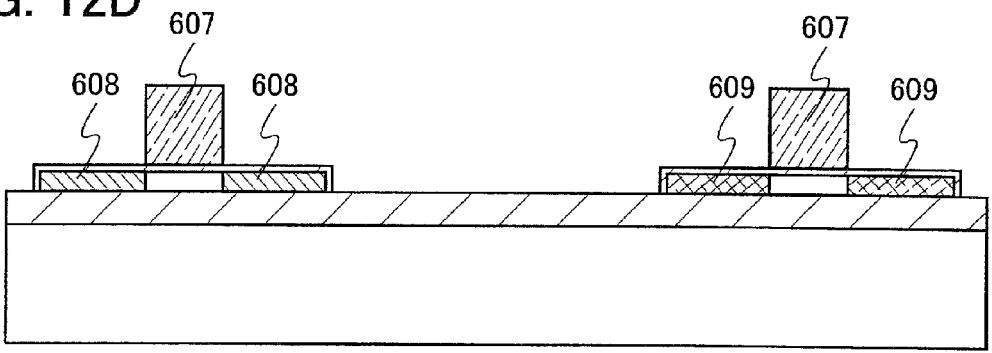

Next, as shown in FIG. 12D, an impurity element imparting one conductivity type is added to the semiconductor films 603 and 604 with the use of the electrodes 607 as masks. In this embodiment, an impurity element imparting p-type conductivity (for example, boron) is added to the semiconductor film 603, and an impurity element imparting n-type conductivity (for example, phosphorus or arsenic) is added to the semiconductor film 604. It is to be noted that when the impurity element imparting p-type conductivity is added to the semiconductor film 603, the semiconductor film 604 to which the n-type impurity is added is covered with a mask or the like so that the addition of the impurity element imparting p-type conductivity is performed selectively. On the other hand, when the impurity element imparting n-type conductivity is added to the semiconductor film 604, the semiconductor film 603 to which the p-type impurity is added is covered with a mask or the like so that the addition of the impurity element imparting n-type conductivity is performed selectively. Alternatively, after the impurity element imparting one of p-type and n-type conductivity is added to the semiconductor film 603 and the semiconductor film 604, the impurity element imparting the other of p-type and n-type conductivity may be selectively added to only one of the semiconductor film 603 or the semiconductor film 604 at higher concentration. By the addition of the impurities, impurity regions 608 are formed in the semiconductor film 603 and impurity regions 609 are formed in the semiconductor film 604.

Figure 13A:
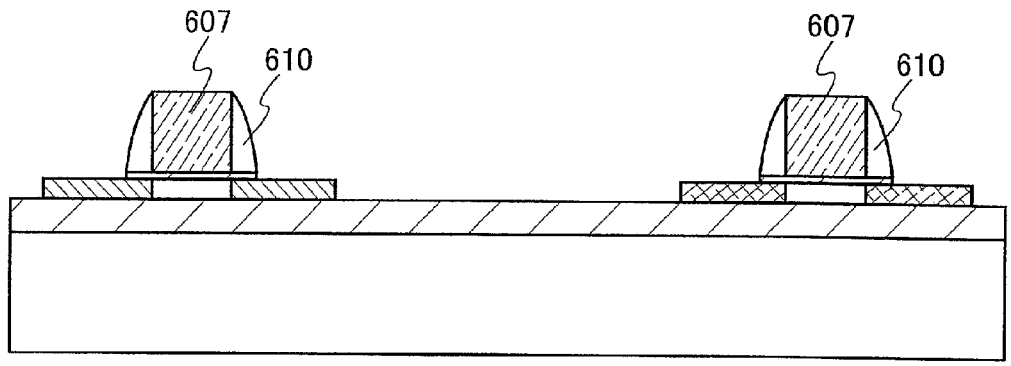
FIGS. 13A to 13C are drawings for describing an embodiment of the present invention.

Next, as shown in FIG. 13A, sidewalls 610 are formed on side surfaces of each of the electrodes 607. For example, the sidewalls 610 can be formed in such a manner that a new insulating film is formed so as to cover the gate insulating film 606 and the electrodes 607 and the newly formed insulating film is partly etched by anisotropic etching in which etching is performed mainly in a perpendicular direction. The newly formed insulating film is partly etched by the above-described anisotropic etching, whereby the sidewalls 610 are formed on the side surfaces of each electrode 607. It is to be noted that the gate insulating film 606 may also be partly etched by the anisotropic etching. The insulating film for forming the sidewalls 610 can be formed of a single layer or a stack of layers of a silicon film, a silicon oxide film, a silicon nitride oxide film, or a film including an organic material such as an organic resin by a plasma CVD method, a sputtering method, or the like. In this embodiment, a 100-nm-thick silicon oxide film formed by a plasma CVD method is used for forming the sidewalls 610. In addition, as an etching gas, a mixed gas of $CHF_3$ and helium can be used. It is to be noted that the steps for forming the sidewalls 610 are not limited to the steps given here.

Figure 13B:
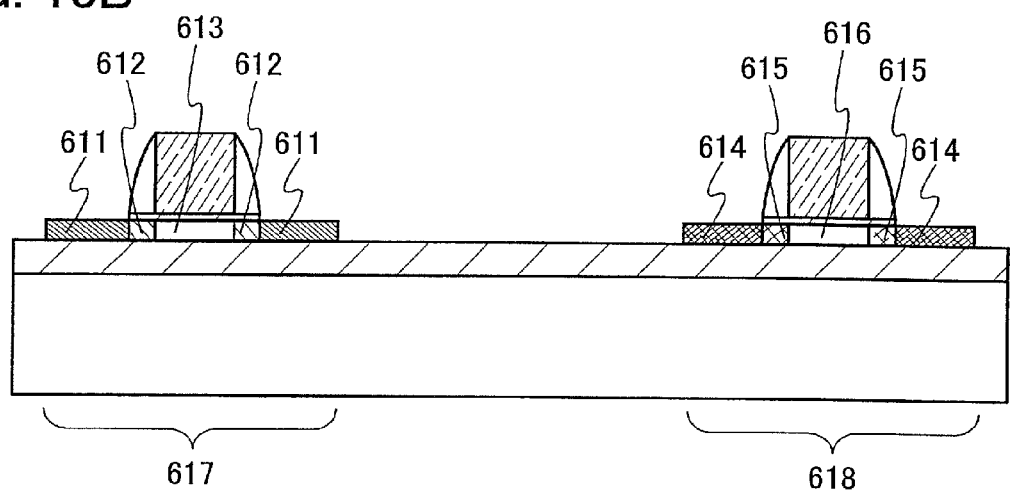

Next, as shown in FIG. 13B, impurity elements imparting one conductivity type are added to the semiconductor films 603 and 604 with the use of the electrodes 607 and the sidewalls 610 as masks. It is to be noted that the impurity elements imparting the same conductivity type as the impurity elements which have been added to the semiconductor films 603 and 604 in the former step are added to the semiconductor films 603 and 604 at higher concentration than in the former step. Note that when the impurity element imparting p-type conductivity is added to the semiconductor film 603, the semiconductor film 604 to which the n-type impurity is added is covered with a mask or the like so that the addition of the impurity element imparting p-type conductivity is performed selectively. On the other hand, when the impurity element imparting n-type conductivity is added to the semiconductor film 604, the semiconductor film 603 to which the p-type impurity is added is covered with a mask or the like so that the addition of the impurity element imparting n-type conductivity is performed selectively.

By the above-described addition of the impurity element, a pair of high concentration impurity regions 611, a pair of low concentration impurity regions 612, and a channel formation region 613 are formed in the semiconductor film 603. In addition, by the above-described addition of the impurity element, a pair of high concentration impurity regions 614, a pair of low concentration impurity regions 615, and a channel formation region 616 are formed in the semiconductor film 604. One of the high concentration impurity regions 611 and one of the high concentration impurity regions 614 function as sources and the others function as drains, and the low concentration impurity regions 612 and 615 function as LDD (lightly doped drain) regions.

It is to be noted that the sidewalls 610 formed over the semiconductor film 604 and the sidewalls 610 formed over the semiconductor film 603 may have either the same or different width in a direction where carriers move. It is preferable that the width of each sidewall 610 over the semiconductor film 604 which constitutes a part of a p-channel transistor be larger than the width of each sidewall 610 over the semiconductor film 603 which constitutes a part of an n-channel transistor. This is because boron which is added for forming the source and the drain of the p-channel transistor easily diffuses so that a short channel effect is easily induced. When the width of the sidewall 610 of the p-channel transistor is made larger, boron can be added to the source and the drain at high concentration, and thus the resistance of the source and the drain can be reduced.

Next, a silicide layer may be formed by siliciding the semiconductor films 603 and 604 in order to further decrease the resistance of the sources and the drains. The siliciding is performed in such a manner that a metal is brought into contact with the semiconductor films, and silicon in the semiconductor films is made to react with the metal by heat treatment such as a GRTA method or an LRTA method. Cobalt silicide or nickel silicide may be used as the silicide. In a case where the semiconductor films 603 and 604 are thin, the siliciding may be continued to the bottom of the semiconductor films 603 and 604 in this region. As a metal material used for the siliciding, the following can be used: titanium (Ti), nickel (Ni), tungsten (W), molybdenum (Mo), cobalt (Co), zirconium (Zr), hafnium (Ha), tantalum (Ta), vanadium (V), neodymium (Nd), chromium (Cr), platinum (Pt), palladium (Pd), or the like. Alternatively, the silicide may be formed by laser irradiation or light irradiation using a lamp or the like.

Through the above-described series of steps, an n-channel transistor 617 and a p-channel transistor 618 are manufactured. As for a p-type semiconductor, the crystal orientation at which the mobility of holes serving as the majority carriers is the highest corresponds to a {110} plane. On the other hand, as for an n-type semiconductor, the crystal orientation at which the mobility of electrons serving as the majority carriers is the highest corresponds to a {100} plane. Accordingly, in the present invention, the plane orientation of the semiconductor film can be selected as appropriate in accordance with the polarity of the semiconductor element, whereby the mobility of the semiconductor element can be increased and a semiconductor device capable of higher-speed operation can be provided.

Figure 13C:
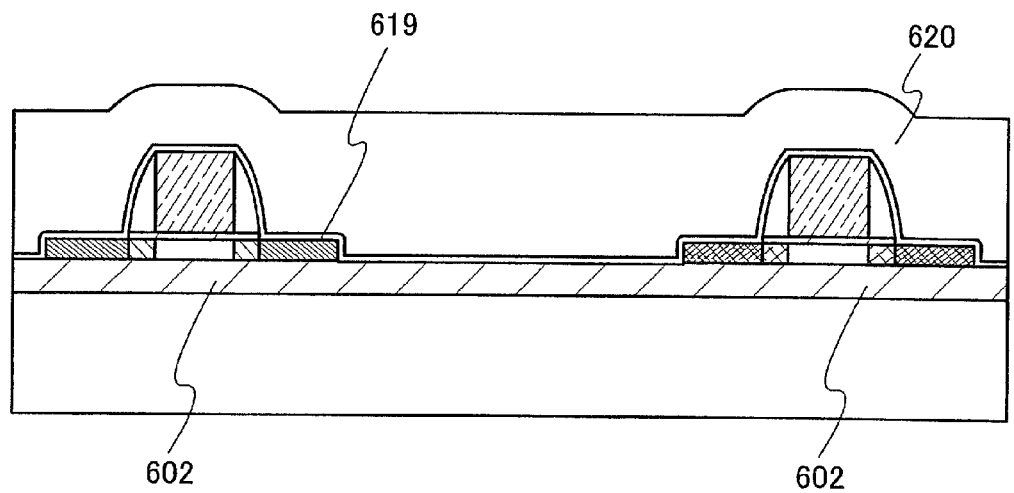

Next, as shown in FIG. 13C, an insulating film 619 is formed so as to cover the transistors 617 and 618. Although the insulating film 619 is not necessarily provided, the provision of the insulating film 619 can prevent impurities such as an alkali metal and an alkaline earth metal from entering the transistors 617 and 618. Specifically, it is preferable to use silicon nitride, silicon nitride oxide, silicon oxynitride, aluminum nitride, aluminum oxide, silicon oxide, or the like as the insulating film 619. In this embodiment, a silicon nitride oxide film formed to a thickness of about 600 nm is used as the insulating film 619. In this case, the hydrogenation treatment described above may be performed after the formation of the silicon nitride oxide film.

Next, an insulating film 620 is formed over the insulating film 619 so as to cover the transistors 617 and 618. An organic material having heat resistance, such as polyimide, acrylic, polyimideamide, benzocyclobutene, polyamide, or epoxy can be used for the insulating film 620. As an alternative to the organic materials listed above, a low-dielectric constant material (a low-k material), a siloxane-based resin, silicon oxide, silicon nitride, silicon nitride oxide, PSG (phosphosilicate glass), BPSG (borophosphosilicate glass), alumina, or the like may be used. A siloxane-based resin may contain as a substituent at least one of fluorine, an alkyl group, and an aromatic hydrocarbon, in addition to hydrogen. Note that the insulating film 620 may be formed by stacking a plurality of insulating films formed of the above materials. The insulating film 620 may have its surface flattened by a CMP method or the like.

In the case where the semiconductor films 603 and 604 are attached to the base substrate 601, an insulating film remains parted between the base substrate 601 and each of the semiconductor films 603 and 604. However, the formation of the insulating film 620 by a coating method with the use of the aforementioned polyimide, siloxane-based resin, or the like makes it possible to prevent the surface of the insulating film 620 from losing its flatness even though there is a difference in height due to the insulating film which remains parted. Accordingly, it is possible to prevent conductive films 621 and 622 to be later formed over the insulating film 620 from being partly thinned drastically due to an uneven surface of the insulating film 620 and to prevent disconnection which might happen in the worst case. Thus, by the formation of the insulating film 620 by a coating method, the yield and reliability of the semiconductor devices formed by the present invention can be increased.

It is to be noted that a siloxane-based resin corresponds to a resin formed using a siloxane-based material as a starting material and having a bond of Si—O—Si. A siloxane-based resin may have as a substituent at least one of fluorine, an alkyl group, and an aromatic hydrocarbon, in addition to hydrogen.

The insulating film 620 can be formed by a CVD method, a sputtering method, an SOG method, spin coating, dipping, spray coating, a droplet discharging method (an ink-jet method, screen printing, offset printing, or the like), a doctor knife, a roll coater, a curtain coater, a knife coater, or the like depending on a material of the insulating film 620.

Figure 14:
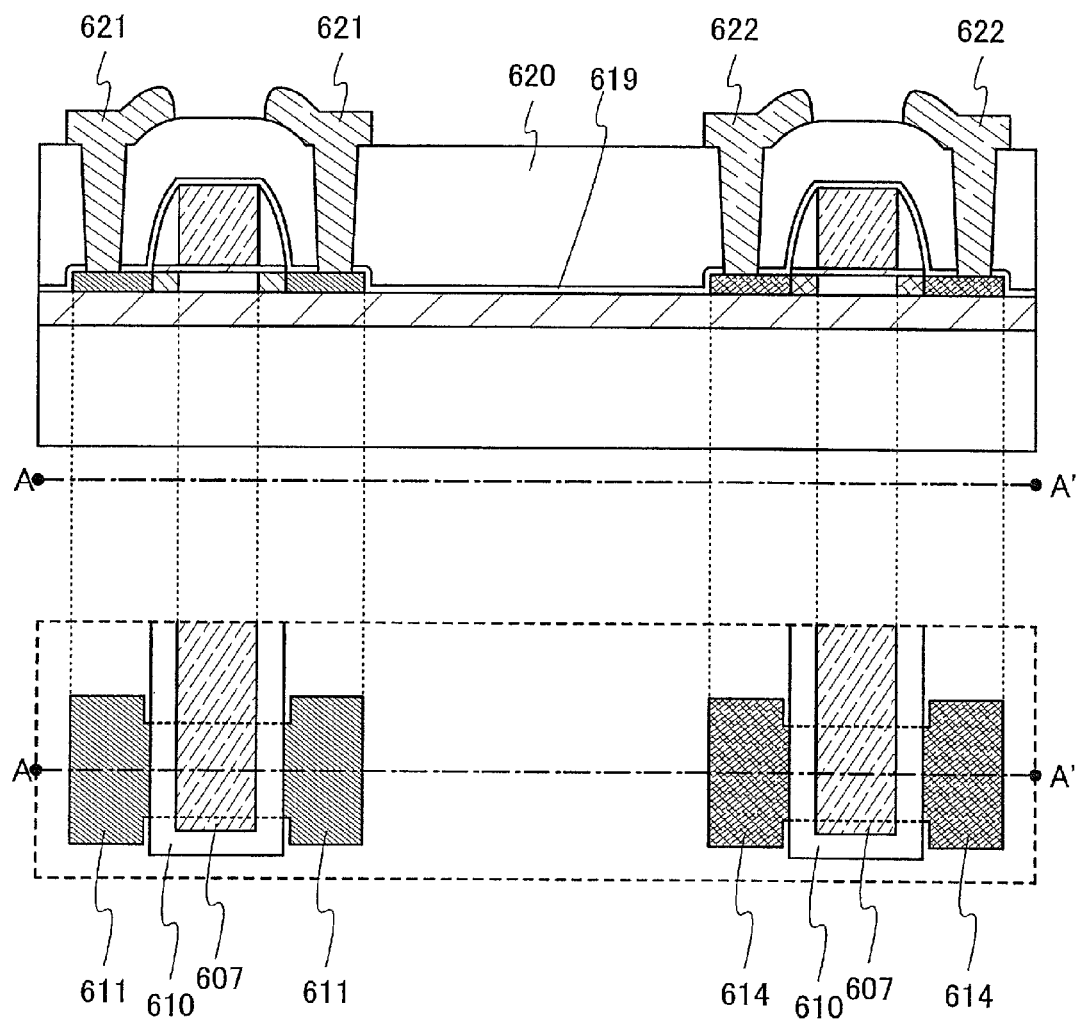
FIG. 14 is a drawing for describing an embodiment of the present invention.

Next, as shown in FIG. 14, contact holes are formed through the insulating film 619 and the insulating film 620 so that each of the semiconductor films 603 and 604 is partly exposed. Then, the conductive films 621 and 622 which are in contact with the semiconductor films 603 and 604 respectively through the contact holes are formed. Although a mixed gas of $CHF_3$ and He is used as an etching gas for forming the contact holes, the etching gas is not limited to this mixed gas.

The conductive films 621 and 622 can be formed by a CVD method, a sputtering method, or the like. Specifically, for the conductive films 621 and 622, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, an alloy including the above-described metal as a main component or a compound including the above-described metal may be used. Each of the conductive films 621 and 622 can be formed as a single layer or a stack of plural layers of a film which includes any of the above-mentioned metals.

As an example of an alloy including aluminum as a main component, an alloy which includes aluminum as a main component and includes nickel can be given. Further, an alloy which includes aluminum as a main component and includes nickel and one of or both carbon and silicon can also be given. Since aluminum and aluminum silicon have low resistance and are inexpensive, they are optimal materials for forming the conductive films 621 and 622. In particular, generation of hillocks in resist baking can be prevented more in the case where an aluminum silicon (Al—Si) film is used for forming the conductive films 621 and 622 by patterning than in the case where an aluminum film is used. Further, instead of silicon (Si), about 0.5% of Cu may be mixed into an aluminum film.

For example, for each of the conductive films 621 and 622, a stacked-layer structure of a barrier film, an aluminum silicon (Al—Si) film, and a barrier film or a stacked-layer structure of a barrier film, an aluminum silicon (Al—Si) film, a titanium nitride film, and a barrier film may be employed. It is to be noted that a barrier film refers to a film formed of titanium, titanium nitride, molybdenum, molybdenum nitride, or the like. When barrier films are formed to sandwich an aluminum silicon (Al—Si) film therebetween, generation of hillocks of aluminum or aluminum silicon can be prevented further. In addition, when a barrier film is formed using titanium, which is a highly-reducible element, even if a thin oxide film is formed over the semiconductor films 603 and 604, the oxide film is reduced by titanium contained in the barrier film, so that favorable contact between the conductive films 621 and 622 and the semiconductor films 603 and 604 can be obtained. Alternatively, a plurality of barrier films may be stacked to be used. In the latter case, for example, each of the conductive films 621 and 622 can have a five-layer structure of Ti, titanium nitride, Al—Si, Ti, and titanium nitride in order from the bottom.

It is to be noted that the conductive film 621 is connected to the high concentration impurity regions 611 of the n-channel transistor 617. The conductive film 622 is connected to the high concentration impurity regions 614 of the p-channel transistor 618.

FIG. 14 is a top view of the n-channel transistor 617 and the p-channel transistor 618. It is to be noted that the conductive films 621 and 622 and the insulating films 619 and 620 are omitted in FIG. 14.

In addition, although this embodiment shows as an example the case where each of the n-channel transistor 617 and the p-channel transistor 618 includes one gate electrode 607 functioning as the gate, the present invention is not limited to this structure. The transistor manufactured in accordance with the present invention may have a multi-gate structure in which a plurality of electrodes functioning as gates is electrically connected to one another.

Moreover, the transistor included in the semiconductor device of the present invention may have a gate planar structure.

This embodiment can be implemented in combination with any of the above embodiment modes as appropriate.

[Embodiment 4]

In this embodiment, a structure of a display device including a driver circuit of the present invention is described.

An active matrix light-emitting device includes a light-emitting element which corresponds to a display element in each pixel. Since a light-emitting element emits light by itself, it has high visibility and does not need a backlight which is required in a liquid crystal display device. Therefore, a light-emitting element is suitable for a thin display device and its viewing angle is not restricted. Although a light-emitting device using an organic light-emitting diode (OLED) which is a kind of a light-emitting element is described in this embodiment, a display device including a driver circuit of the present invention may be a light-emitting device using another light-emitting element.

The OLED includes an anode layer, a cathode layer, and a layer (hereinafter, referred to as an electroluminescent layer) including a material from which luminescence (electroluminescence) can be obtained by application of an electric field. As electroluminescence, there are luminescence (fluorescence) at the time of returning to a ground state from a singlet-excited state and luminescence (phosphorescence) at the time of returning to a ground state from a triplet-excited state. In a light-emitting device manufactured in accordance with the present invention, one of or both fluorescence and phosphorescence may be used.

Figure 15:
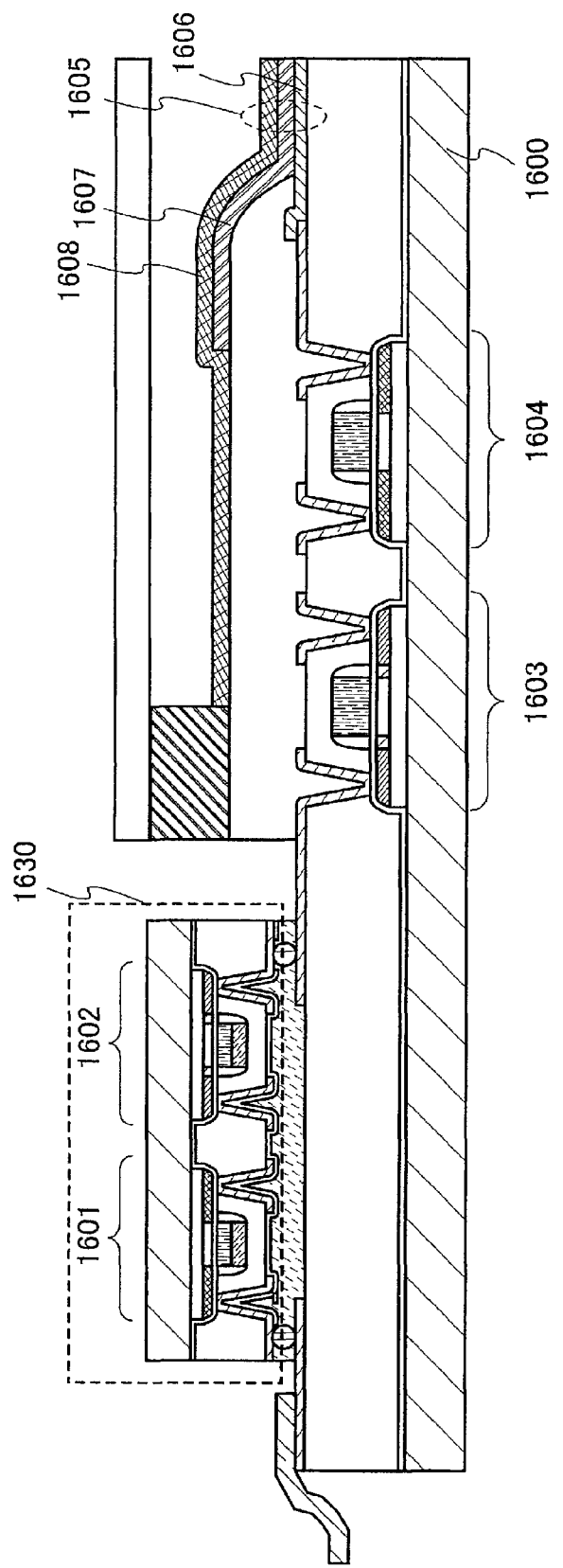
FIG. 15 is a drawing for describing an embodiment of the present invention.

FIG. 15 is a cross-sectional view of a light-emitting device of this embodiment. The light-emitting device shown in FIG. 15 has the following over an element substrate 1600: a transistor 1601 and a transistor 1602 which are used for a driver circuit of a stick driver 1630, and a driver transistor 1604 and a switching transistor 1603 which are used for a pixel. The light-emitting device shown in FIG. 15 also has a light-emitting element 1605 in the pixel over the element substrate 1600. It is to be noted that the stick driver 1630 is fixed to the element substrate 1600 by an adhesive and electrically connected to an external circuit and pixels through leading terminals by spherical conductive members.

The light-emitting element 1605 has a pixel electrode 1606, an electroluminescent layer 1607, and a counter electrode 1608. One of the pixel electrode 1606 and the counter electrode 1608 serves as an anode and the other serves as a cathode.

The anode can be formed of a light-transmitting oxide conductive material such as indium tin oxide including silicon oxide (ITSO), indium tin oxide (ITO), zinc oxide (ZnO), indium zinc oxide (IZO), or gallium-doped zinc oxide (GZO). Further alternatively, other than the above-described light-transmitting oxide conductive material, a single-layer film including one or more of titanium nitride, zirconium nitride, Ti, W, Ni, Pt, Cr, Ag, Al, and the like; a stack of layers of a titanium nitride film and a film including aluminum as a main component; a three-layer structure of a titanium nitride film, a film including aluminum as a main component, and a titanium nitride film; or the like can be used for the anode. However, in the case of extracting light from the anode side when the anode is formed of a material other than the light-transmitting oxide conductive material, the anode is formed to a thickness such that it transmits light (preferably, about 5 nm to 30 nm).

Note that a conductive composition including a conductive macromolecule (also referred to as a conductive polymer) can be used for the anode. The conductive composition preferably has a sheet resistance of 10000 Ω/square or less and a light transmittance of 70% or more at a wavelength of 550 nm when the conductive composition is formed into a conductive film serving as an anode. Moreover, the conductive macromolecule included in the conductive composition preferably has a resistivity of 0.1 Ω·cm or less.

The conductive macromolecule may be a so-called at-electron conjugated conductive macromolecule. For example, polyaniline and/or a derivative thereof, polypyrrole and/or a derivative thereof, polythiophene and/or a derivative thereof, and a copolymer of plural kinds of those materials can be given as the n-electron conjugated conductive macromolecule.

As specific examples of a conjugated conductive macromolecule, the following can be given: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The aforementioned conductive macromolecule may be used alone as the conductive composition for the anode. Alternatively, in order to adjust the film characteristics such as the uniformity in the thickness of the film of the conductive composition and the film strength thereof, an organic resin may be added to the aforementioned conductive macromolecule.

As for the organic resin, a thermosetting resin, a thermoplastic resin, or a photocurable resin may be used as long as the resin is compatible to a conductive macromolecule or the resin can be mixed and dispersed into a conductive macromolecule. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 6,6, polyamide 12, or polyamide 11; a fluorine resin such as poly(vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins can be used.

Further, in order to adjust the electrical conductivity of the conductive composition, the conductive composition may be doped with an acceptor dopant or a donor dopant to change the oxidation-reduction potential of a conjugated electron in the conjugated conductive macromolecule.

As the acceptor dopant, a halogen compound, Lewis acid, proton acid, an organic cyano compound, an organometallic compound, or the like can be used. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid and organic acid such as organic carboxylic acid and organic sulfonic acid can be given. As the organic carboxylic acid and the organic sulfonic acid, the above-described carboxylic acid compounds or sulfonic acid compounds can be used. As the organic cyano compound, a compound having a plurality of cyano groups in a conjugated bonding, for example, tetracyanoethylene, tetracyanoethylene oxide, tetracyanobenzene, tetracyanoquinodimethane, tetracyanoazanaphthalene, and the like are given.

As the donor dopant, there are an alkali metal, an alkaline earth metal, a quaternary amine compound, and the like.

Alternatively, the conductive composition is dissolved in water or an organic solvent (such as an alcohol-based solvent, a ketone-based solvent, an ester-based solvent, a hydrocarbon-based solvent, or an aromatic-based solvent) and a wet process is used, whereby a thin film which serves as the anode can be formed.

There is no particular limitation on the solvent in which the conductive composition is dissolved, as long as the above-described conductive macromolecule and the macromolecular resin compound such as an organic resin are dissolved. For example, the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methyletylketone, methylisobutylketone, toluene, or the like.

After the conductive composition is dissolved in the solvent as described above, a film thereof can be formed by a wet process such as a coating method, a droplet discharging method (also referred to as an inkjet method), or a printing method. The solvent may dried by heat treatment or may be dried under reduced pressure. In the case where the organic resin is a thermosetting resin, heat treatment may be performed further. In the case where the organic resin is a photocurable resin, light irradiation treatment may be performed.

The cathode can be formed in general by using a metal, an alloy, an electrically conductive compound, or a mixture thereof, each of which has a low work function. Specifically, a rare earth metal such as Yb or Er as well as an alkali metal such as Li or Cs, an alkaline earth metal such as Mg, Ca, or Sr, or an alloy including these (Mg:Ag, Al:Li, or the like) can be used. When a layer including a material having a high electron-injecting property is formed in contact with the cathode, a general conductive film of aluminum, a light-transmitting oxide conductive material, or the like can be used.

The electroluminescent layer 1607 may be formed as a single layer or a stack of plural layers, each layer of which may include an inorganic material in addition to an organic material. The luminescence of the electroluminescent layer 1607 includes luminescence (fluorescence) at the time of returning from a singlet-excited state to a ground state and luminescence (phosphorescence) at the time of returning from a triplet-excited state to a ground state. When the electroluminescent layer 1607 is formed to have a plurality of layers and the pixel electrode 1606 serves as the cathode, the electroluminescent layer 1607 is formed by stacking an electron-injecting layer, an electron-transporting layer, a light-emitting layer, a hole-transporting layer, and a hole-injecting layer in order over the pixel electrode 1606. When the pixel electrode 1606 corresponds to the anode, the electroluminescent layer 1607 is formed by stacking a hole-injecting layer, a hole-transporting layer, a light-emitting layer, an electron-transporting layer, and an electron-injecting layer in order.

The electroluminescent layer 1607 can be formed by a droplet discharging method with use of any of a macromolecular organic compound, an intermolecular organic compound (an organic compound which does not have a subliming property but has a molecular chain length of 10 μm or less), a low molecular organic compound, and an inorganic compound. In a case of using an intermolecular organic compound, a low molecular organic compound, or an inorganic compound, the electroluminescent layer 1607 may be formed by an evaporation method.

The switching transistor 1603 and the driver transistor 1604 may each have a multigate structure such as a double gate structure or a triplet gate structure instead of having a single gate structure. Moreover, instead of using a semiconductor film obtained from a single-crystal semiconductor substrate, an amorphous semiconductor film or a polycrystalline semiconductor film may be used for semiconductor layers of the switching transistor 1603 and the driver transistor 1604.

Figure 16:
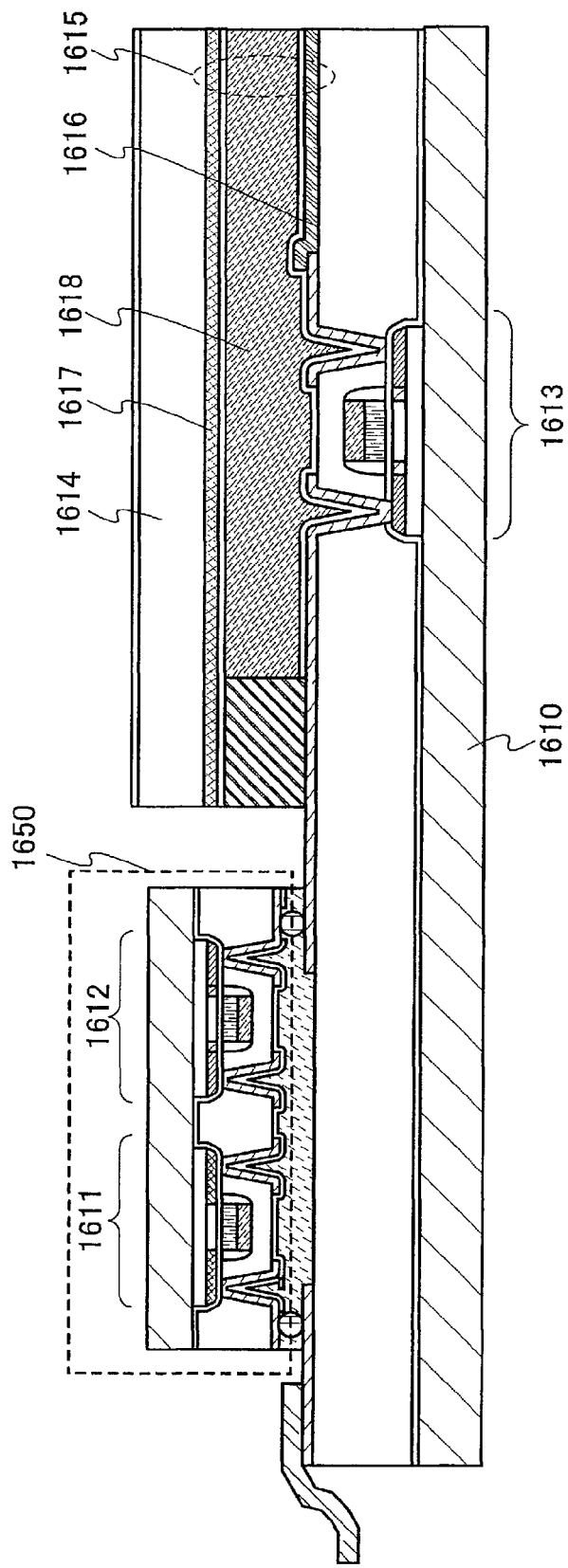
FIG. 16 is a drawing for describing an embodiment of the present invention.

FIG. 16 is a cross-sectional view of a liquid crystal display device of this embodiment. The liquid crystal display device shown in FIG. 16 has over an element substrate 1610, a transistor 1611 and a transistor 1612 which are used for a driver circuit of a stick driver 1650, and a transistor 1613 which functions as a switching element in a pixel. The liquid crystal display device shown in FIG. 16 has a liquid crystal cell 1615 between the element substrate 1610 and a counter substrate 1614. It is to be noted that the stick driver 1650 is fixed to the element substrate 1610 by an adhesive and is electrically connected to an external circuit and pixels through leading terminals by spherical conductive members.

The liquid crystal cell 1615 has a pixel electrode 1616 formed over the element substrate 1610, a counter electrode 1617 formed on the counter substrate 1614, and a liquid crystal 1618 provided between the pixel electrode 1616 and the counter electrode 1617. The pixel electrode 1616 can be formed of, for example, indium tin oxide including silicon oxide (ITSO), indium tin oxide (ITO), zinc oxide (ZnO), indium zinc oxide (IZO), gallium-doped zinc oxide (GZO), or the like.

The transistor 1613 may have a multigate structure such as a double gate structure or a triplet gate structure instead of having a single gate structure. Moreover, instead of using a semiconductor film obtained from a single-crystal semiconductor substrate, an amorphous semiconductor film or a polycrystalline semiconductor film may be used for a semiconductor layer of the transistor 1613. As the liquid crystal 1618, a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. Above all, a normally black liquid crystal panel such as a transmissive liquid crystal display device utilizing a vertical alignment (VA) mode is preferable. Some examples are given as the vertical alignment mode. For example, an MVA (multi-domain vertical alignment) mode, a PVA (patterned vertical alignment) mode, and an ASV mode can be used. In specific, one pixel is divided into a plurality of sub-pixels and a projection is provided at a position of the counter substrate corresponding to the center of each sub-pixel, so that multi-domain pixel is formed. Note that the projection is provided for at least one of the counter substrate and the element substrate. The projection makes liquid crystal molecules align radially and improves controllability of the alignment.

This embodiment can be implemented in combination with any of the above embodiment modes or embodiments as appropriate.

[Embodiment 5]

Figure 17:
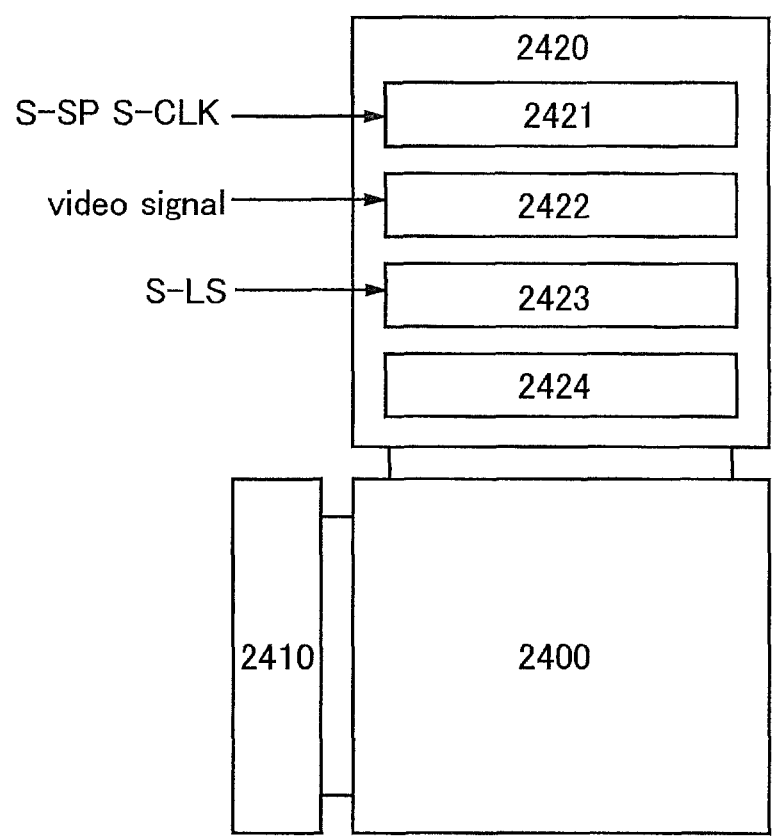
FIG. 17 is a drawing for describing an embodiment of the present invention.

In this embodiment, an overall structure of a display device including a driver circuit of the present invention is described. FIG. 17 is a block diagram of a display device including a driver circuit of the present invention, as an example.

The display device shown in FIG. 17 includes a pixel portion 2400 having a plurality of pixels, a scanning line driver circuit 2410 for selecting pixels per line, and a signal line driver circuit 2420 for controlling the input of video signals to pixels of a selected line.

In FIG. 17, the signal line driver circuit 2420 includes a shift register 2421, a first latch 2422, a second latch 2423, and a DA (digital to analog) converting circuit 2424. A clock signal S-CLK and a start pulse signal S-SP are input to the shift register 2421. The shift register 2421 generates timing signals, pulses of which are sequentially shifted, in accordance with the clock signal S-CLK and the start pulse signal S-SP and outputs the timing signals to the first latch 2422. The order of pulses of the timing signals may be switched following a signal for switching a scanning direction.

Upon the input of the timing signals to the first latch 2422, video signals are sequentially written into and held in the first latch 2422 in accordance with pulses of the timing signals. The video signals may be sequentially written in a plurality of memory circuits in the first latch 2422; alternatively, the memory circuits in the first latch 2422 may be divided into some groups and the video signals may be input to the memory circuits group by group in parallel, that is, so-called division driving may be performed. It is to be noted that the number of groups at this time is called a division number. For example, in a case where a latch is divided into groups such that each group has four memory circuits, division driving is performed with four divisions.

The time until video signal writing into all of the memory circuits of the first latch 2422 is completed is called a line period. In practice, a line period may include a horizontal retrace line period.

When one line period is completed, the video signals held in the first latch 2422 are written into the second latch 2423 all at once and held in accordance with a pulse of a latch signal S-IS which is input to the second latch 2423. The next video signals are sequentially written into the first latch 2422 which has finished sending the video signals to the second latch 2423, in accordance with timing signals from the shift register 2421 again. During this second round of the one line period, the video signals written into and held in the second latch 2423 are input to the DA converting circuit 2424.

Next, the DA converting circuit 2424 converts the input digital video signals into analog video signals, which are then input to each pixel in the pixel portion 2400 through signal lines.

It is to be noted that in the signal line driving circuit 2420, a circuit which can output signals, pulses of which sequentially shift, may be used instead of the shift register 2421.

Although the pixel portion 2400 is directly connected to the next stage of the DA converting circuit 2424 in FIG. 17, the present invention is not limited to this structure. A circuit which processes the video signal output from the DA converting circuit 2424 can be provided in the previous stage of the pixel portion 2400. Examples of the circuit which processes signals include a buffer which can shape a waveform and the like.

Next, an operation of the scanning line driver circuit 2410 is explained. In the display device manufactured by the present invention, each pixel in the pixel portion 2400 is provided with a plurality of scanning lines. The scanning line driver circuit 2410 generates a selection signal, inputs the selection signal to each of the scanning lines, and thus selects pixels per line. When the pixels are selected by the selection signal, transistors whose gates are connected to one scanning line are turned on; thus, the video signals are input to the pixels.

In the present invention, each transistor in the driver circuit is formed using a semiconductor film obtained from a single-crystal semiconductor substrate; therefore, variation in characteristics between the transistors in the driver circuit can be reduced. As a result, the scanning line driver circuit 2410 and the signal line driver circuit 2420 operate with fewer errors and images of high quality can be obtained in the pixel portion 2400.

This embodiment can be implemented in combination with any of the above embodiment modes or embodiments as appropriate.

[Embodiment 6]

In accordance with the present invention, a display device which has a narrower frame region and which includes a driver circuit with less influence by variation in transistor characteristics can be manufactured. Therefore, the display device including the driver circuit of the present invention is preferably used as a display device for information display, a laptop personal computer, or an image playback device which is provided with a recording medium (typically a device which plays a recording medium such as a DVD (digital versatile disc) and which has a display capable of displaying the image). Moreover, the display device including the driver circuit of the present invention can be used for an electronic appliance such as a cellular phone, a portable game machine, an electronic book, a video camera, a digital still camera, a goggle type display (head mount display), a navigation system, or a sound playback device (such as a car audio system or an audio composition). Specific examples of these electronic appliances are shown in FIGS. 18A to 18C.

Figure 18A:
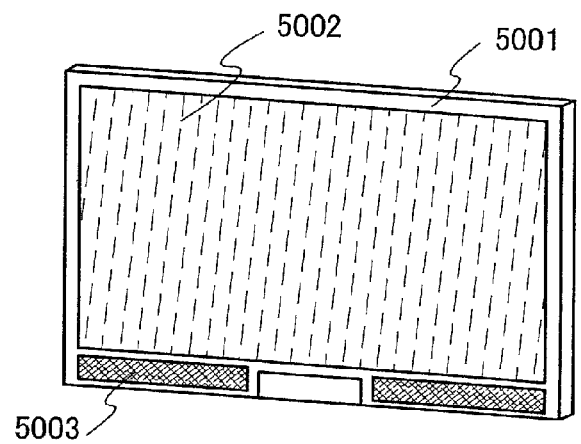
FIGS. 18A to 18C are drawings for describing an embodiment of the present invention.

FIG. 18A shows a display device for information display, which includes a housing 5001, a display portion 5002, speaker portions 5003, and the like. The display device including the driver circuit of the present invention can be used for the display portion 5002. It is to be noted that the display device includes all display devices for information display, such as display devices for a personal computer, TV broadcast reception display, advertisement display, and the like.

Figure 18B:
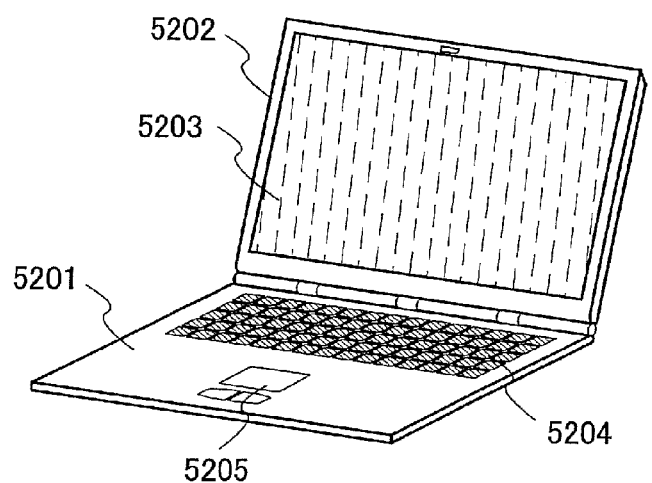

FIG. 18B shows a laptop personal computer including a main body 5201, a housing 5202, a display portion 5203, a keyboard 5204, a pointing device 5205, and the like. The display device including the driver circuit of the present invention can be used for the display portion 5203.

Figure 18C:
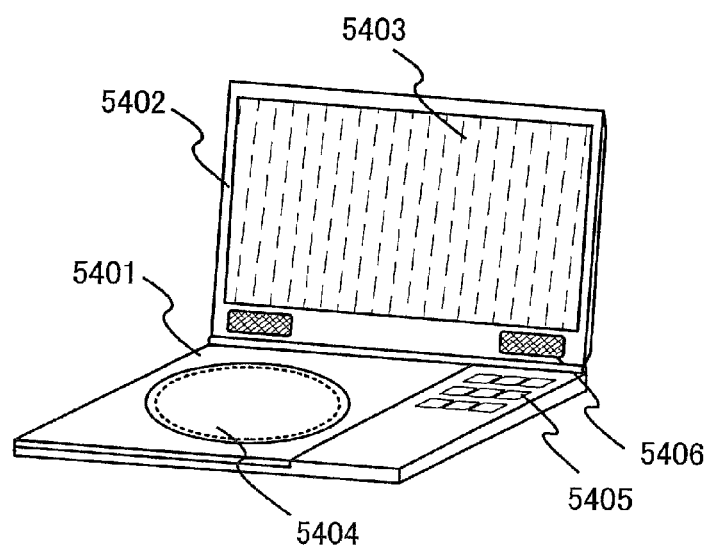

FIG. 18C shows a portable image playback device provided with a recording medium (specifically, a DVD playback device), which includes a main body 5401, a housing 5402, a display portion 5403, a recording medium (DVD or the like) reading portion 5404, an operation key 5405, speaker portions 5406, and the like. The image playback device provided with the recording medium includes a home-use game console and the like. The display device including the driver circuit of the present invention can be used for the display portion 5403.

As thus described, the present invention can be applied in quite a wide range, and can be applied to electronic appliances of every field.

This embodiment can be implemented in combination with any of the above embodiment modes or embodiments as appropriate.

This application is based on Japanese Patent Application serial no. 2007-222787 filed with Japan Patent Office on Aug. 29, 2007, the entire contents of which are hereby incorporated by reference.

What is claimed is:

1. A method of manufacturing a display device comprising:
   forming a defect layer in a single-crystal semiconductor substrate by introducing hydrogen ions into the single-crystal semiconductor substrate;
   separating a first single-crystal semiconductor film from the single-crystal semiconductor substrate;
   attaching the first single-crystal semiconductor film to a base substrate;
   separating a second single-crystal semiconductor film from the single-crystal semiconductor substrate;

attaching the second single-crystal semiconductor film to the base substrate;

forming a driver circuit comprising a plurality of thin film transistors by using the first single-crystal semiconductor film and the second single-crystal semiconductor film attached to the base substrate;

dividing the base substrate into an elongated substrate having the driver circuit; and attaching the elongated substrate having the driver circuit to a substrate having a pixel portion.

2. The method of manufacturing a display device according to claim 1, wherein the first single-crystal semiconductor film and the second single-crystal semiconductor film are separated from the single-crystal semiconductor substrate by performing heat treatments.

3. The method of manufacturing a display device according to claim 1, wherein the single-crystal semiconductor substrate is a single-crystal semiconductor substrate of silicon, silicon germanium, gallium arsenide, or indium phosphide.

4. The method of manufacturing a display device according to claim 1, wherein the first single-crystal semiconductor film and the second single-crystal semiconductor film separated from the single-crystal semiconductor substrate are attached and bonded to the base substrate in a longitudinal direction of the driver circuit.

5. The method of manufacturing a display device according to claim 1, wherein the base substrate is a polycrystalline semiconductor substrate or a metal substrate.

6. The method of manufacturing a display device according to claim 1, wherein the display device is a liquid crystal display device, a light-emitting display device, a digital micromirror display device, a plasma display panel, or a field emission display device.

7. The method of manufacturing a display device according to claim 1, wherein the display device is provided in an electronic appliance selected from a personal computer, a laptop computer, a DVD, a cellular phone, a portable game machine, an electronic book, a video camera, a digital still camera, a head mount display, a navigation system, a car audio system, a home-use game console, a TV broadcast reception display, and an advertisement display.

8. The method of manufacturing a display device according to claim 1, wherein the base substrate comprises a resin.

9. A method of manufacturing a display device comprising:

forming a first defect layer in a first single-crystal semiconductor substrate by introducing hydrogen ions into the first single-crystal semiconductor substrate;

separating a first single-crystal semiconductor film from the first single-crystal semiconductor substrate;

attaching the first single-crystal semiconductor film to a base substrate;

forming a second defect layer in a second single-crystal semiconductor substrate by introducing hydrogen ions into the second single-crystal semiconductor substrate;

separating a second single-crystal semiconductor film from the second single-crystal semiconductor substrate;

attaching the second single-crystal semiconductor film to the base substrate;

forming a driver circuit comprising a first thin film transistor by using the first single-crystal semiconductor film and a second thin film transistor by using the second single-crystal semiconductor film;

dividing the base substrate into an elongated substrate having the driver circuit; and attaching the elongated substrate having the driver circuit to a substrate having a pixel portion, wherein the first single-crystal semiconductor film in the first thin film transistor and the second single-crystal semiconductor film in the second thin film transistor have different crystal plane orientation.

10. The method of manufacturing a display device according to claim 9, wherein a first plurality of thin film transistor are formed by using the first single crystal semiconductor film and a second plurality of thin film transistor are formed by using the second single crystal semiconductor film.

11. The method of manufacturing a display device according to claim 9, wherein thermal treatment is performed to separate the first single-crystal semiconductor substrate at the first defect layer and the second single-crystal semiconductor substrate at the second defect layer.

12. The method of manufacturing a display device according to claim 9, wherein each of the first single-crystal semiconductor substrate and the second single-crystal semiconductor substrate is a single-crystal semiconductor substrate of silicon, silicon germanium, gallium arsenide or indium phosphide.

13. The method of manufacturing a display device according to claim 9, wherein the first single-crystal semiconductor film and the second single-crystal semiconductor film are attached and bonded to the base substrate in a longitudinal direction of the driver circuit.

14. The method of manufacturing a display device according to claim 9, wherein the base substrate is a polycrystalline semiconductor substrate or a metal substrate.

15. The method of manufacturing a display device according to claim 9, wherein the display device is a liquid crystal display device, a light-emitting display device, a digital micromirror display device, a plasma display panel, a field emission display device.

16. The method of manufacturing a display device according to claim 9, wherein the display device is provided in an electronic appliance selected from a personal computer, a laptop computer, a DVD, a cellular phone, a portable game machine, an electronic book, a video camera, a digital still camera, a head mount display, a navigation system, a car audio system, a home-use game console, a TV broadcast reception display, and an advertisement display.

17. The method of manufacturing a display device according to claim 9, wherein the base substrate comprises a resin.

* * * * *

UNITED STATES PATENT AND TRADEMARK OFFICE
CERTIFICATE OF CORRECTION

PATENT NO. : 8,730,419 B2
APPLICATION NO. : 13/649738
DATED : May 20, 2014
INVENTOR(S) : Shunpei Yamazaki It is certified that error appears in the above-identified patent and that said Letters Patent is hereby corrected as shown below:

In the Specification

At column 6, line 48, "like:" should be --like.--;

At column 13, line 47, "collect" should be --collet--;

At column 13, line 50, "collect" should be --collet--;

At column 13, line 55, first occurrence, "collect" should be --collet--;

At column 13, line 55, second occurrence, "collect" should be --collet--;

At column 13, line 60, "collect" should be --collet--;

At column 19, line 66, "and," should be --and--;

At column 27, lines 58-59, "at-electron" should be --π-electron--;

At column 27, line 63, "n-electron" should be --π-electron--;

At column 31, line 27, "S-IS" should be --S-LS--.

Signed and Sealed this
Ninth Day of September, 2014

Michelle K. Lee
*Deputy Director of the United States Patent and Trademark Office*